(12) United States Patent
Clark et al.

(10) Patent No.: US 9,880,311 B2
(45) Date of Patent: Jan. 30, 2018

(54) WEAR RESISTANT ELECTRODES FOR DOWNHOLE IMAGING

(71) Applicant: Schlumberger Technology Corporation, Sugar Land, TX (US)

(72) Inventors: Brian O. Clark, Sugar Land, TX (US); Jacques Orban, Katy, TX (US); Jonathan D. Marshall, Springville, UT (US); Scott R. Woolston, Provo, UT (US); Daniel Hendricks, Provo, UT (US); Neil Cannon, Woodland Hills, UT (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 14/699,053

(22) Filed: Apr. 29, 2015

(65) Prior Publication Data
US 2016/0320516 A1 Nov. 3, 2016

(51) Int. Cl.
*G01V 3/24* (2006.01)
*G01R 3/00* (2006.01)

(52) U.S. Cl.
CPC . *G01V 3/24* (2013.01); *G01R 3/00* (2013.01)

(58) Field of Classification Search
USPC .................. 324/368, 369; 73/152.59, 865.8; 340/853.7
See application file for complete search history.

(56) References Cited

U.S. PATENT DOCUMENTS

| | | | |
|---|---|---|---|
| 2,411,696 A * | 11/1946 | Silverman | E21B 47/122 340/853.7 |
| 4,794,322 A | 12/1988 | Davies | |
| 6,410,877 B1 | 6/2002 | Dixon et al. | |
| 2004/0051531 A1 | 3/2004 | Chemali et al. | |
| 2005/0056421 A1 | 3/2005 | Homan et al. | |
| 2007/0229304 A1 | 10/2007 | Hall et al. | |
| 2008/0284440 A1 | 11/2008 | Moore | |
| 2009/0289808 A1 | 11/2009 | Prammer | |
| 2010/0162824 A1 | 7/2010 | Jamshidi et al. | |
| 2012/0005966 A1 | 1/2012 | Cleboski et al. | |
| 2012/0186874 A1 | 7/2012 | Malone et al. | |

(Continued)

FOREIGN PATENT DOCUMENTS

WO 2010054353 A2 5/2010

OTHER PUBLICATIONS

International Search Report and Written Opinion issued in related PCT application PCT/US2016/029302 on Aug. 25, 2016, 15 pages.

(Continued)

*Primary Examiner* — Vincent Q Nguyen

(57) ABSTRACT

Devices and methods for well logging using a wear resistant electrode are provided. A downhole device may include a drill bit, a gauge pad mounted on the drill bit, and a first electrode mounted in the gauge pad. An insulating polycrystalline diamond (PCD) material may surround at least a portion of the first electrode. Additionally, the first electrode may include an electrically conductive wear resistant contact point that maintains constant contact with a wall of a wellbore. Additionally, the first electrode may measure an impedance of a geological formation during a drilling operation.

4 Claims, 29 Drawing Sheets

(56) References Cited

U.S. PATENT DOCUMENTS

| | | |
|---|---|---|
| 2013/0020130 A1 | 1/2013 | Trinh et al. |
| 2014/0053666 A1 | 2/2014 | Aronstam et al. |
| 2014/0198827 A1 | 7/2014 | Liversage |
| 2014/0298728 A1* | 10/2014 | Keshavan ............... E21B 10/56 51/298 |
| 2015/0012217 A1* | 1/2015 | Legendre ............. E21B 47/082 702/7 |

OTHER PUBLICATIONS

International Search Report and Written Opinion issued in related PCT application PCT/US2016/029448 on Aug. 9, 2016, 12 pages.

Non-Final Office Action issued in U.S. Appl. No. 14/699,009 dated Oct. 5, 2016. 8 pages.

Final Office Action issued in U.S. Appl. No. 14/699,009 dated Apr. 24, 2017. 10 pages.

* cited by examiner

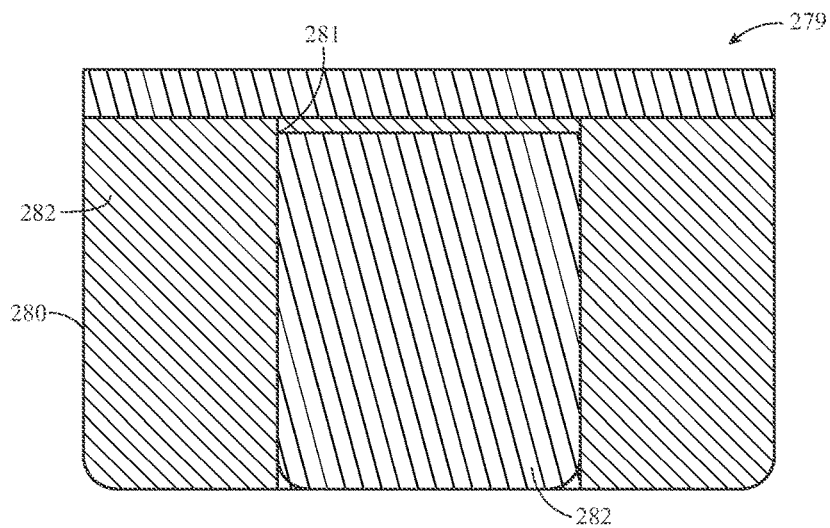
FIG. 39
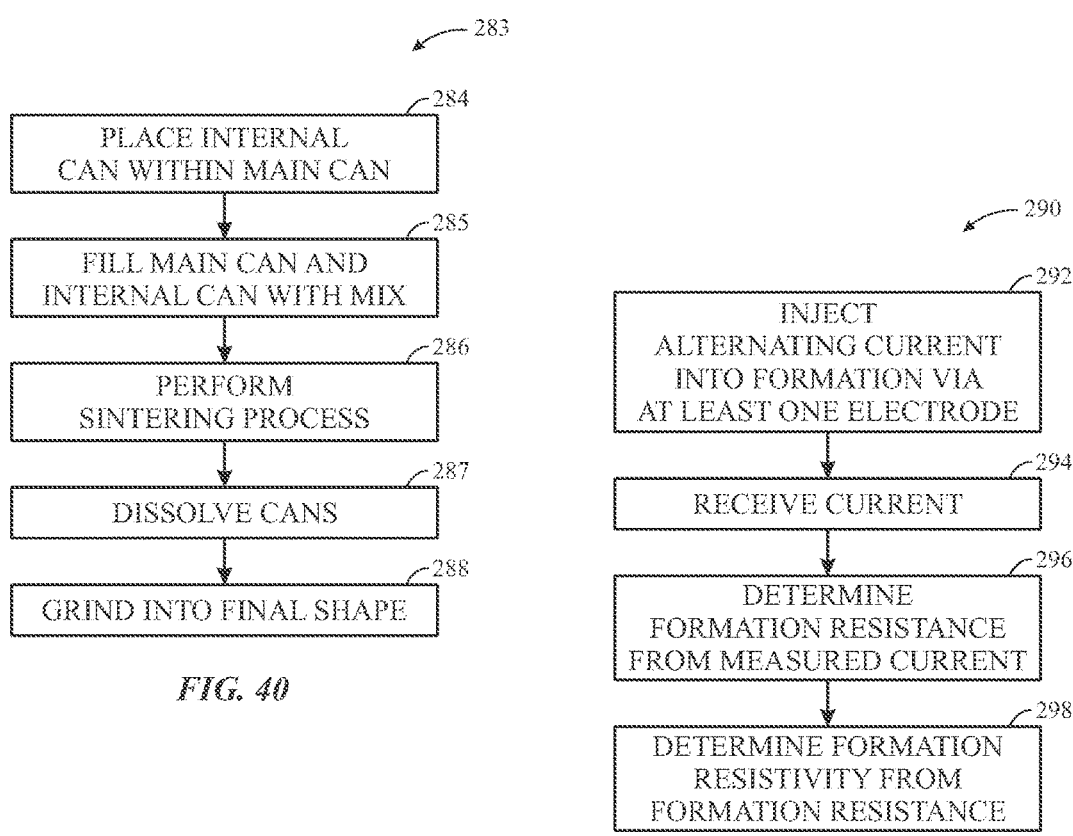
FIG. 40
FIG. 41

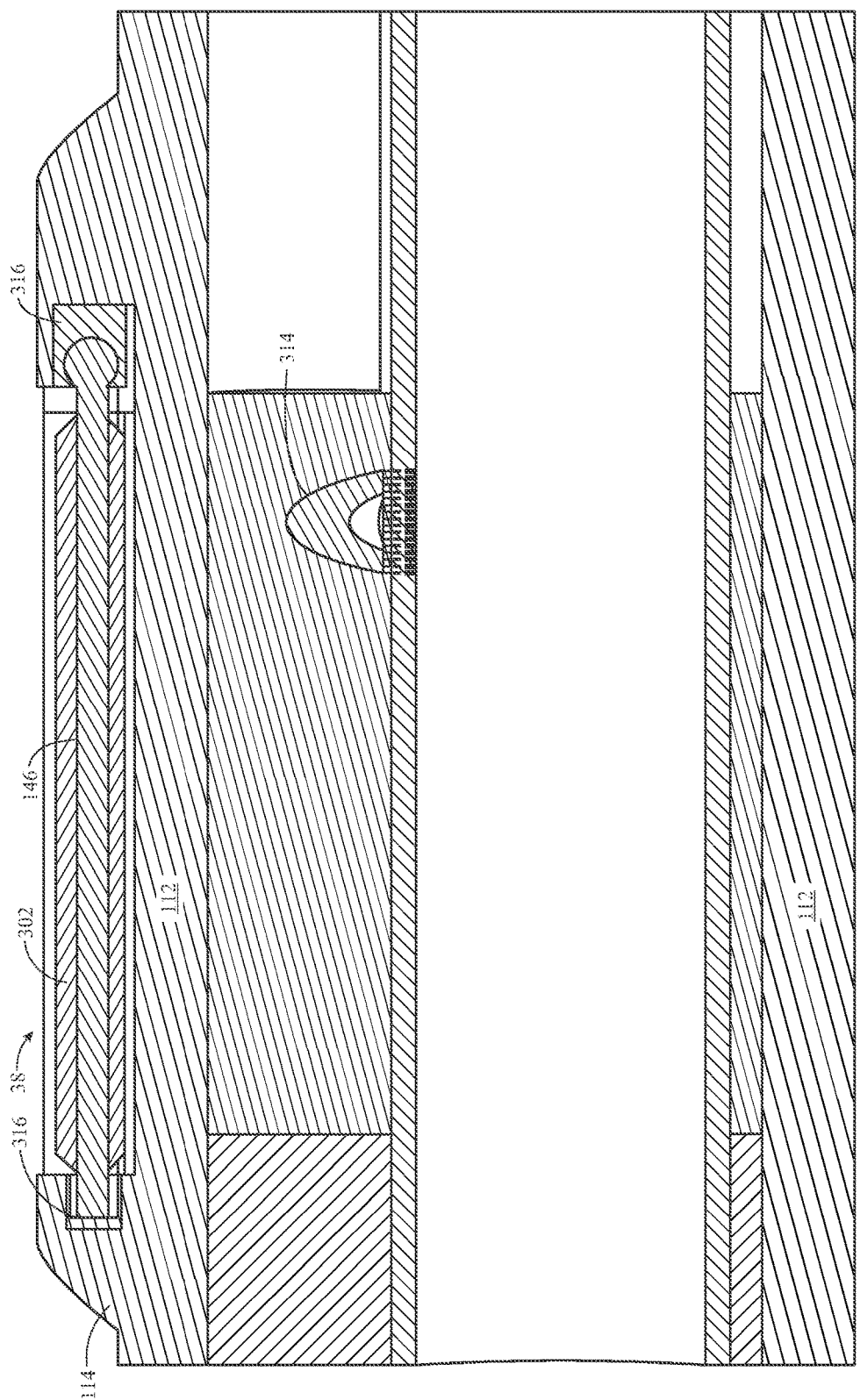

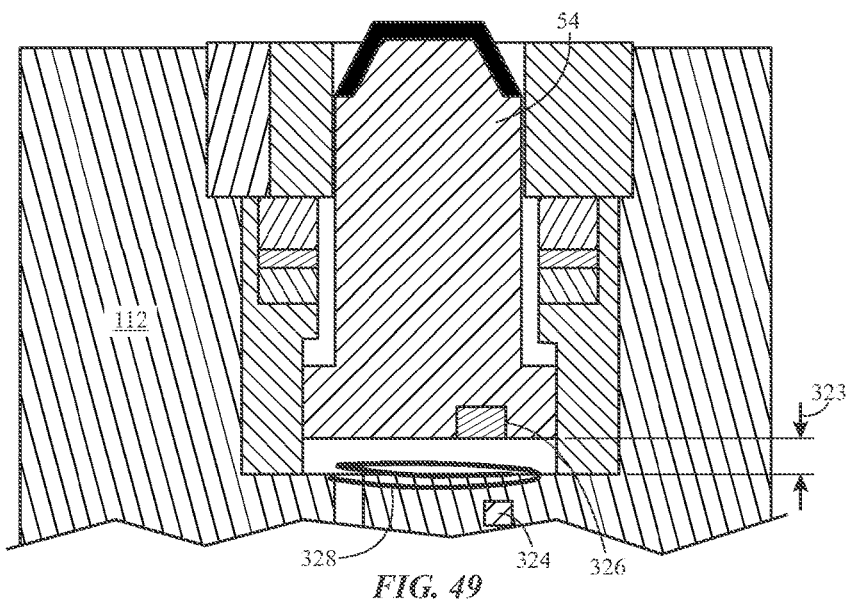
FIG. 49
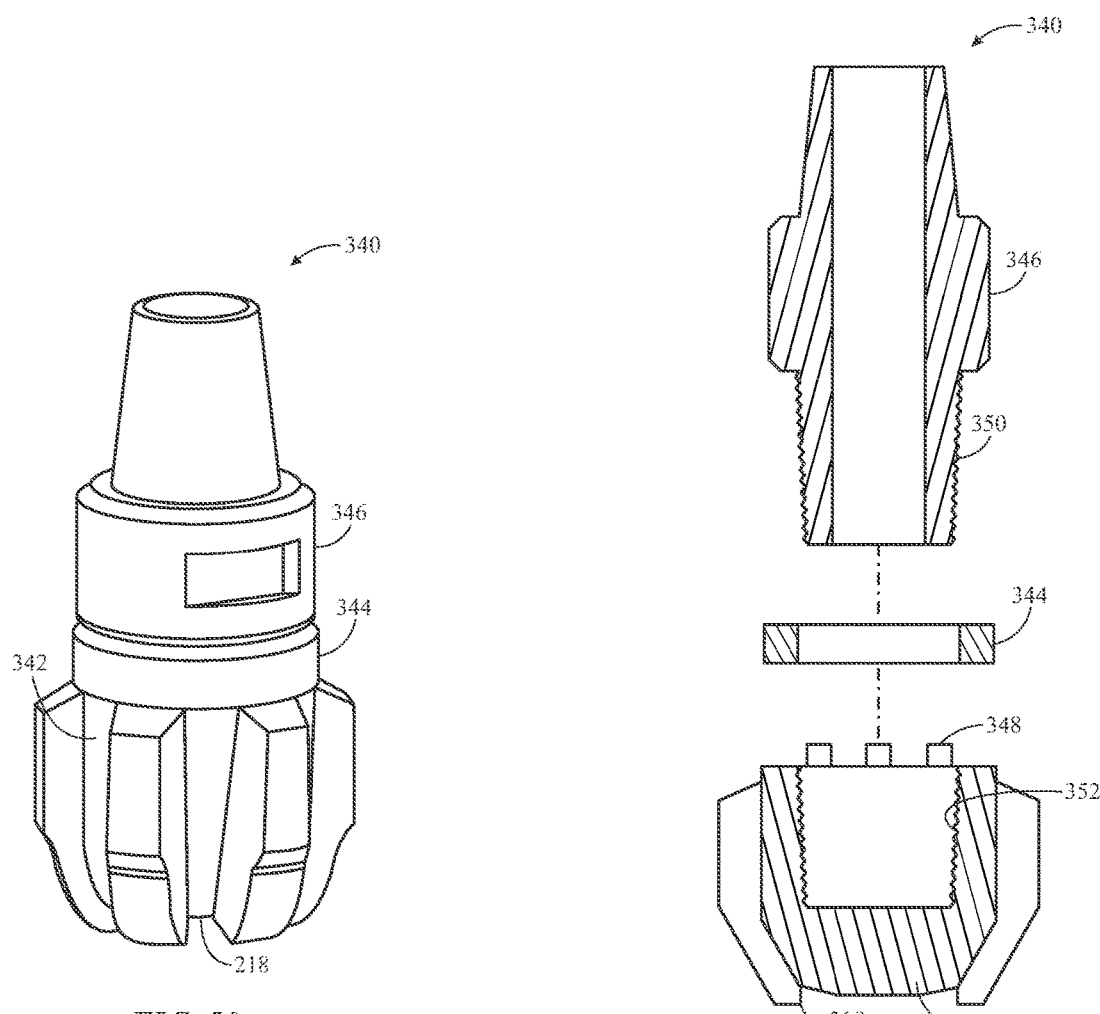
FIG. 50
FIG. 51

WEAR RESISTANT ELECTRODES FOR DOWNHOLE IMAGING

BACKGROUND

This disclosure relates to well-logging using a sensor assembly having a polycrystalline diamond (PCD) electrode.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

Identifying the composition of a geological formation can provide information about the likely presence or absence of hydrocarbons. As such, many downhole tools have been developed that attempt to analyze the geological formation from within a wellbore. These tools include, among other things, formation electrical resistivity logging tools. By measuring the electrical resistivity through the geological formation, the composition of the geological formation may be ascertained at various depths through the well.

But a downhole tool might not operate effectively if the downhole tool measurements cannot penetrate borehole fluid in the wellbore that functions as an insulator between the downhole tool and the geological formation. By forcing the downhole tool against the wellbore wall, less wellbore fluid may intervene. Applying pressure to the downhole tool against the wellbore wall, or scraping the downhole tool against the wellbore wall, however, may cause the downhole tool to erode or break.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure relate to well logging using wear-resistant electrodes. A downhole device may include a drill bit, a gauge pad mounted on the drill bit, and a first electrode mounted in the gauge pad. An insulating polycrystalline diamond (PCD) material may surround at least a portion of the wear-resistant contact point. The first electrode may include an electrically conductive wear-resistant contact point that maintains constant contact with a wall of a wellbore. Additionally, the first electrode may measure an impedance of a geological formation during a drilling operation.

In another example, a downhole device may include a drill collar and at least two electrodes mounted on the drill collar. The at least two electrodes may include PCD faces formed with diamond grains and an electrically conductive solvent-catalyst, and the at least two electrodes may include a carbide base. Further, the at least two electrodes may be movably mounted within the drill collar, and the at least two electrodes may be configured to extend and retract into a wellbore to maintain contact with a wall of the wellbore. Furthermore, one of the at least two electrodes may include a toroidal coil to measure an impedance of a geological formation.

Moreover, a method may include placing a downhole tool in a wellbore in a geological formation. The downhole tool may include at least one electrode including a PCD material, at least one transmitting toroidal transformer, and at least one measure toroidal transformer. Additionally, the method may include injecting alternating current into the geological formation via the at least one electrode, receiving return current from the formation via a contact point of the downhole tool with the formation, and determining a formation resistance from the return current. Further, the method may include determining a formation resistivity from the formation resistance.

Further, a method of manufacturing a PCD electrode may include mixing grid materials of regions of the composite PCD electrode to desired ratios. The method may also include providing the grid materials to a sintering can in areas corresponding to the regions of the composite PCD electrode. Additionally, the method may include performing a final sintering process on the grid materials.

In another example, a downhole device may include a drill collar and a probe mounted on the drill collar. The probe may include a first electrode and a second electrode. Additionally, the first electrode and the second electrode may include PCD faces formed with diamond grains and an electrically conductive solvent-catalyst. The probe may also include a carbide base. Further, the probe may be movably coupled within the drill collar, and the probe may extend and retract into a wellbore to maintain contact with a wall of the wellbore. Furthermore, the probe may be configured to measure impedance of a geological formation.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 39 is a cross-sectional view of a sintering device used to fabricate an insulating ring, in accordance with an embodiment;

FIG. 40 is a flowchart of a method for forming the insulating ring of FIG. 39, in accordance with an embodiment;

FIG. 41 is a flowchart of a method to determine a formation resistivity of the geological formation with PCD electrodes, in accordance with an embodiment;

FIG. 46 is a cross-sectional view of the hinged pad of FIG. 43 and a hinge coupled to the hinge pad, in accordance with an embodiment;

FIG. 49 is a cross-sectional view of the PCD electrode of FIG. 2 within a drill collar with a device for detecting a radial extension, in accordance with an embodiment;

FIG. 50 is a perspective view of a drill bit, in accordance with an embodiment;

FIG. 51 is an exploded cross-sectional view of the drill bit of FIG. 50, in accordance with an embodiment.

DETAILED DESCRIPTION

Figure 1:
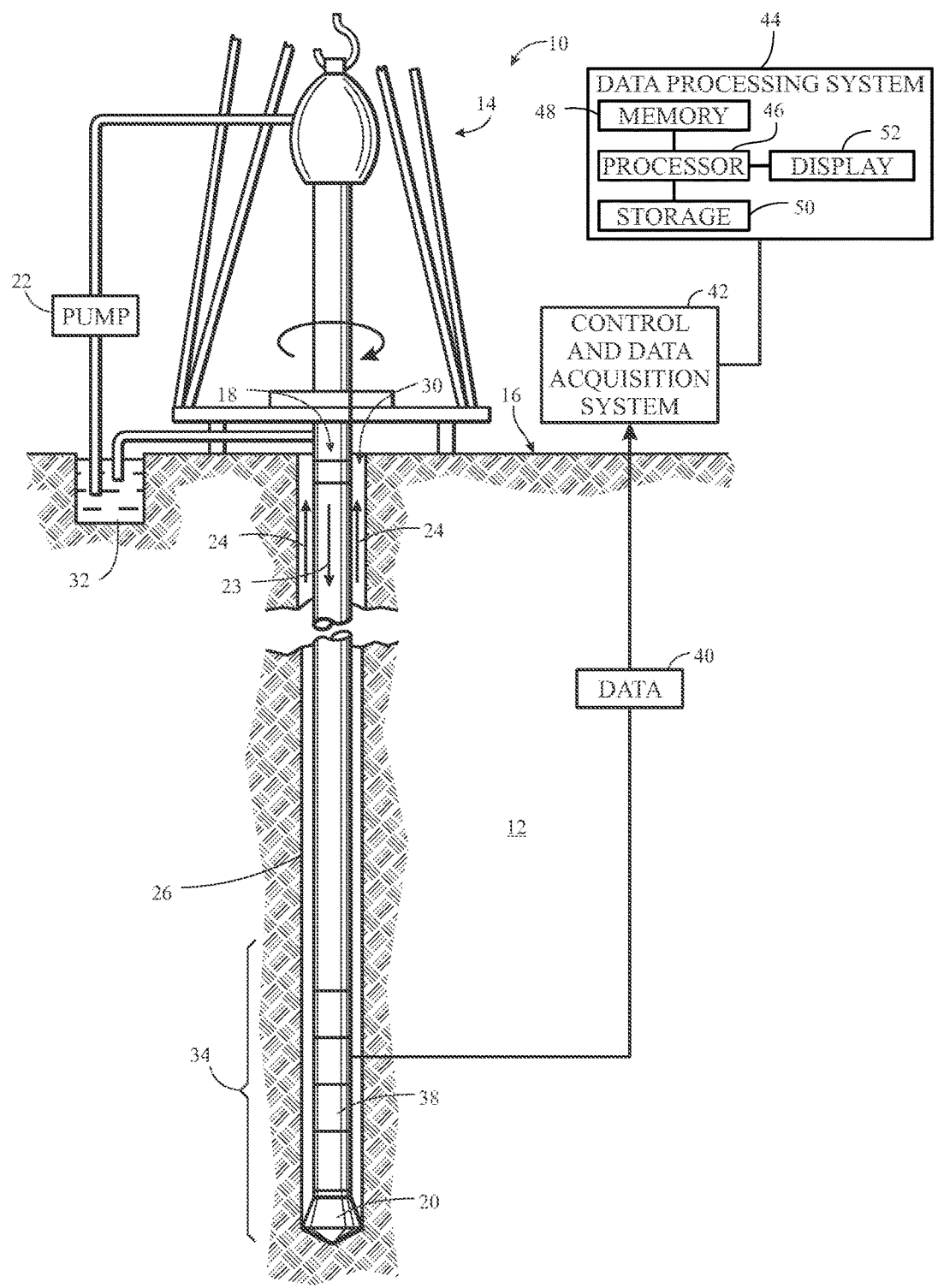
FIG. 1 is a schematic diagram of a drilling system that includes a formation resistivity logging tool with a polycrystalline diamond electrode, in accordance with an embodiment.

One or more specific embodiments of the present disclosure will be described below. These described embodiments are examples of the presently disclosed techniques. Additionally, in an effort to provide a concise description of these embodiments, features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

One way to identify hydrocarbon pay zones in a geological formation is through geological formation electrical resistivity logging. Geological formation electrical resistivity logging, as described in this disclosure, relates to using electrical resistivity characteristics of the geological formation. Hydrocarbon molecules in the geological formation, such as reservoir oil, may affect resistivity of the geological formation in a known manner. Hence, with electrical resistivity logging, the presence of reservoir oil can be identified by comparing a measured resistivity to known values representing geological formations containing oil.

As noted above, a downhole tool may not be able to predict the properties of the geological formation if the downhole tool measurements cannot penetrate borehole fluid in the wellbore. Indeed, borehole fluid in the wellbore may provide an insulating layer between a downhole tool and the geological formation. If this happens, the downhole tool may emit and detect current not from the geological formation, but rather from the borehole fluid moving through the wellbore. By compressing the downhole tool against the wellbore wall, less wellbore fluid may intervene.

To ensure the integrity of the downhole tool while the downhole tool is compressed against the wellbore wall, transmitting and/or receiving electrodes of the downhole tool, which may maintain contact with the wellbore wall, may be formed using a polycrystalline diamond (PCD). The PCD structure of the electrodes may be less likely to erode or break when pressed against the geological formation than an electrode made mostly from a metal or metal alloy. Indeed, the electrode may maintain mechanical contact with the geological formation during a logging-while-drilling operation (LWD) without much erosion or breakage. The electrode may be located, for example, on a stabilizer blade of a borehole assembly (BHA) or even on a drill bit of the BHA.

With this in mind, FIG. 1 illustrates a drilling system 10 that includes a logging tool with such an electrode. The drilling system 10 may be used to drill a well into a geological formation 12 and obtain electrical resistivity measurements useful to identify characteristics of the geological formation 12. In the drilling system 10, a drilling rig 14 at the surface 16 may rotate a drill string 18 having a drill bit 20 at its lower end. As the drill bit 20 is rotated, a drilling fluid pump 22 is used to pump drilling fluid 23, which may be referred to as "mud" or "drilling mud," downward through the center of the drill string 18 in the direction of the arrow to the drill bit 20. The drilling fluid 23, which is used to cool and lubricate the drill bit 20, exits the drill string 18 through the drill bit 20. The drilling fluid 23 then carries drill cuttings away from the bottom of a wellbore 26 as it flows back to the surface 16, as shown by the return drilling fluid 24 represented by arrows through an annulus 30 between the drill string 18 and the geological formation 12. However, as described above, as the drilling fluid 23 flows through the annulus 30 between the drill string 18 and the geological formation 12, the drilling fluid 23 may begin to invade and mix with the fluids stored in the formation, which may be referred to as formation fluid (e.g., natural gas or oil). At the surface 16, return drilling fluid 24 is filtered and conveyed back to a mud pit 32 for reuse.

As illustrated in FIG. 1, the lower end of the drill string 18 includes a bottom-hole assembly (BHA) 34 that may include the drill bit 20 along with various downhole tools. The downhole tools may collect a variety of information relating to the geological formation 12 and/or the state of drilling of the well. For instance, a measurement-while-drilling (MWD) tool 36 may measure certain drilling parameters, such as the temperature, pressure, orientation of the drilling tool, and so forth. Likewise, a logging-while-drilling (LWD) tool 38 may measure the physical properties of the geological formation 12, such as density, porosity, resistivity, lithology, and so forth. The MWD tool 36 and/or the LWD tool 38 may include an electrical resistivity tool that emits and/or detects current through the geological formation 12. In certain embodiments, the electrical resistivity tool may be located on a stabilizer blade of the BHA or even the drill bit 20.

The MWD tool 36 and/or the LWD tool 38 may collect a variety of data 40 that may be stored and processed in the BHA or, as illustrated in FIG. 1, may be sent to the surface for processing. In the example of this disclosure, the MWD tool 36 and/or the LWD tool 38 may include an electrical resistivity tool that emits and/or detects electrical current via a PCD electrode. The data 40 that is collected may include electrical current levels that return to the electrical resistivity tool that may contain information relating to characteristics of the geological formation 12. The data 40 may be sent via a control and data acquisition system 42 to a data processing system 44. The control and data acquisition system 42 may receive the data 40 in any suitable way. In one example, the control and data acquisition system 42 may transfer the data 40 via electrical signals pulsed through the geological formation 12 or via mud pulse telemetry using the drilling fluid 23. Further, the data 40 may also be sent to the control and data acquisition system 42 via a wired drill pipe. In another example, the data 40 may be retrieved directly from the MWD tool 36 and/or the LWD tool 38 upon return to the surface.

The data processing system 44 may include a processor 46, memory 48, storage 50, and/or a display 52. The data processing system 44 may use the data 40 to determine various properties of the well using any suitable techniques. As will be discussed further below, the MWD tool 36 and/or LWD tool 38 may obtain the data 40 while maintaining mechanical contact with the geological formation 12 without erosion or breakage of the electrical resistivity tool. Thus, high resolution data (i.e., approximately ½ inch resolution) may be collected from the geological formation 12 when the wellbore 26 is filled with either conductive water based mud (WBM) or insulative oil based mud (OBM).

To process the data 40, the processor 46 may execute instructions stored in the memory 48 and/or storage 50. As such, the memory 48 and/or the storage 50 of the data processing system 44 may be any suitable article of manufacture that can store the instructions. The memory 48 and/or the storage 50 may be ROM memory, random-access memory (RAM), flash memory, an optical storage medium, or a hard disk drive, to name a few examples. The display 52 may be any suitable electronic display that can display the logs and/or other information relating to properties of the well as measured by the MWD tool 36 and/or the LWD tool 38. It may be appreciated that, although the data processing system 44 is shown by way of example as being located at the surface, the data processing system 44 may be located in the MWD tool 36 and/or the LWD tool 38. In such embodiments, some of the data 40 may be processed and stored downhole, while some of the data 40 may be sent to the surface in real time. This may be the case particularly in LWD, where a limited amount of the data 40 may be transmitted to the surface during drilling or reaming operations.

Figure 2:
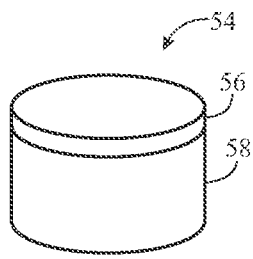
FIG. 2 is a perspective view of a polycrystalline diamond (PCD) electrode, in accordance with an embodiment.

It should be noted that, although the electrical resistivity tool of this disclosure is described by way of example in a logging-while-drilling (LWD) configuration, any other suitable means of conveyance may be employed (e.g., wireline, slickline, coiled tubing, and so forth). One example of a PCD electrode 54 used in the electrical resistivity tool appears in FIG. 2. Electrical or electromagnetic borehole imaging in the drilling fluid 23 using oil based mud (OBM) may use close contact between the electrode 54 and the geological formation 12. Since the OBM is highly resistive, a layer of the OBM between the electrode 54 and the geological formation 12 may degrade electrical imaging capabilities (e.g., electrical resistivity measurements). Most electrical and electromagnetic measurements are available through a layer of OBM less than about $\frac{1}{8}^{th}$ of an inch thick between the PCD electrode 54 and a wall of the wellbore 26. Accordingly, the LWD tool 38 may benefit from the electrode 54 maintaining contact or close proximity to the borehole wall of the wellbore 26.

Electrodes used in wireline imaging tools may be too fragile for the LWD environment. A typical wireline logging operation might involve logging 1000 feet of open hole. A 1000 foot LWD job might take 20 hours at a rate of penetration (ROP) of 50 feet per hour. In an 8.5 inch diameter borehole, each revolution corresponds to approximately 2.25 feet of azimuthal displacement. For a typical rate of 180 RPMs, the azimuthal distance covered during 1000 feet of drilling may exceed 486,000 feet. Thus, the LWD tool 38 in contact with the borehole wall may experience 486 times more contact with the borehole wall than a wireline tool. Further, forces experienced during a drilling operation by the LWD tool 38 are orders of magnitude greater than forces experienced in wireline logging. Hence, the LWD tool 38 may benefit from a rugged design.

Accordingly, the PCD electrode 54 used in the LWD tool 38 may include a layer of polycrystalline diamond (PCD) 56 and a carbide base 58 (e.g., tungsten carbide). The PCD 56 may be resilient to the wear and abrasion of the drilling process. Additionally, the carbide base 58 may support the impact and the load on the PCD electrode 54 during the LWD process, and the carbide base 58 may further allow the PCD 56 to be brazed to other devices (e.g., the drill bit 20). The combination of the PCD 56 and the carbide base 58 is facilitated by both materials having similar properties. These properties may include similar thermal expansion coefficients of the materials and similar Young's moduli of the materials. The properties may be sufficiently similar such that the two materials adequately track under temperature and elastic stresses.

Figure 3:
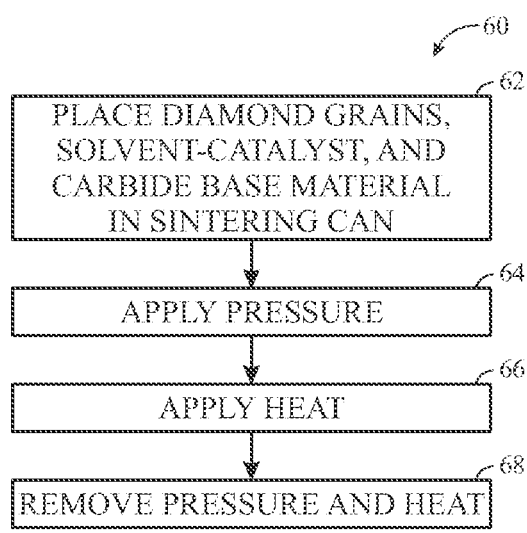
FIG. 3 is a flowchart of a method for manufacturing the PCD electrode of FIG. 2, in accordance with an embodiment.

With the above in mind, FIG. 3 depicts a flowchart of a method 60 for forming the PCD 56. The method 60 may be described as a sintering process. During the sintering process, the PCD 56 may be formed on a top portion of the carbide base 58 (e.g., a tungsten carbide block). Additionally, the sintering process enables the growth of diamond (i.e., carbon) bonds between adjacent diamond grains to form a polycrystalline structure (i.e., the PCD 56). Initially, diamond grains and a solvent-catalyst material are placed in a sintering can (block 62). A size spectrum of the diamond grains placed in the sintering may generally span a few microns to as many as 40 microns or more. The size spectrum of the diamond grains enables achievement of a desired volume of diamond in the PCD 56. Further, a solid material, such as a metal powder, may be added as the solvent-catalyst material. For example, cobalt is commonly used as the solvent-catalyst material. In this case, the cobalt fills pore space among the diamond grains in the PCD 56.

PCD material can be optimized to obtain specific mechanical properties, which may improve performance of the PCD 56 as drill bit components. For example, for a polycrystalline diamond compact (PDC) cutter of a drill bit, some useful properties of the PCD material 56 are wear resistance, impact resistance, and thermal stability. The PCD material 56 may be optimized for enhanced performance of these properties. To obtain high resistance to wear, the PDC cutter may be made from fine diamond grains. For example, the diamond grains may be less than 10 microns in diameter. This may improve longevity as any loss of diamond is limited to small pieces.

Additionally, to improve impact resistance, the PDC cutter may contain large diamond grains of approximately 40 microns in diameter. With large diamond grains, any impact induced fracture may have a higher probability of being blocked by a large diamond grain. This is because the diamond grain itself is stronger than a bond between multiple diamond grains. Also, as the PCD 56 is polycrystalline, a fracture in one diamond grain may not easily propagate into another of the diamond grains, as the crystals are randomly oriented.

To improve thermal stability, the PDC cutter may be treated with acid to leach the cobalt (or other solvent-catalyst) from pore spaces between the diamond grains. The leaching process removes a layer of cobalt near the surface. Under drilling conditions, the edge of the PDC cutter may become extremely hot due to friction. When temperatures of several hundred degrees Celsius occur at a cutting tip of the PDC cutter, the cobalt thermal expansion may induce cracks into the diamond matrix and, thus, break the bonds between the diamond grains. This may reduce a useful lifespan of the drill bit. Removing the layer of cobalt may reduce opportunities for cracking due to thermal expansion. However, leached PDC cutters may be less impact resistant than unleached PDC cutters due to a potential for stress concentration occurring near a void left in the pore spaces after leaching.

When the PCD 56 is used where friction is an issue, leaching may enhance a useful lifespan by lowering a coefficient of friction of the PCD 56. The coefficient of friction between two objects comprising the PCD material can be as low as 5%. This may be much lower than the typical coefficient of friction for most other materials (e.g. up to 30%). Low friction is a benefit with applications of the PCD material such as diamond thrust bearings.

Further, leaching may reduce the risk of surface hydraulic lock. Surface hydraulic lock may occur between two smooth surfaces (e.g., between a thrust bearing and a face seal) that operate in fluid under pressure. The leached surfaces include empty micro-cavities which may be filled with pressurized fluids to avoid a locking effect. The reduction of the locking effect may depend on a type of micro-cavities and a method to supply pressurized fluid in these cavities.

After placing the diamond grains and the solvent-catalyst material in the sintering can based on desired characteristics of the PCD 56, pressure is applied to the sintering can (block 64). The pressure may be applied such that the diamond grains, previously under gentle contact, are pressed against each other. This pressure induces elastic deformation of the diamond grains.

Next, heat is applied along with the pressure to the sintering can (block 66). As a temperature applied to the sintering can increases, some diamond material may revert into graphite in zones of low pressure (i.e., minimal contact stress). Additionally, the solvent-catalyst (e.g., cobalt powder) may begin to melt and occupy spaces created by gaps in the diamond material.

At a point after the heat is applied to the sintering can, additional solvent-catalyst between the diamond grains may come from a tungsten carbide substrate. As the diamond grains are still under high contact stress and the molten solvent-catalyst is under high pressure, carbon-carbon bonds may grow between the diamond grains. This produces the polycrystalline structure of the PCD 56. After sufficient growth time, pressure and temperature are reduced in a controlled fashion until room condition is achieved (block 68).

For the sintering process to occur, melted cobalt enables pressure transmission onto the carbon grains. In addition, the cobalt acts as a solvent-catalyst for the carbon bonds to grow. Additionally, several metals may act as the solvent-catalyst in the PCD sintering process (i.e., the method 60). For example, iron is well known to allow high solubility of carbon (e.g., in the process of making iron pigs). However, experience shows that cobalt produces high quality PCD material with a minimal residual volume of catalyst after the sintering process occurs. Additionally, the cobalt may be provided by the tungsten carbide substrate. In a shear cutter application, for example, cobalt volume after sintering may be in the range of 4% to 7%. During block 68 of the method 60, the cobalt remains inside the diamond table. At the end of the method 60, the diamond table is attached to the tungsten carbide substrate.

Figure 4:
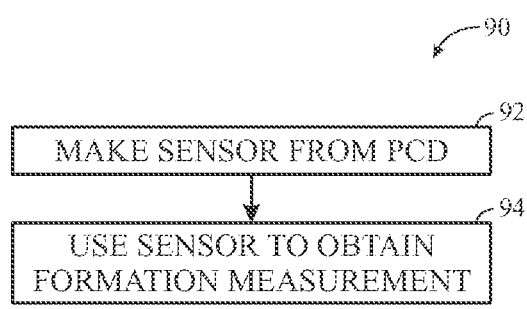
FIG. 4 is a flowchart of a method for obtaining a formation measurement with the PCD electrode of FIG. 2, in accordance with an embodiment.

Turning now to operations of the PCD electrode 54, FIG. 4 depicts a method 90 for using the PCD electrode 54 as a sensor to obtain formation measurements. Initially, the sensor is created using the method 60 (block 92), as described above. Subsequently, the sensor, using the PCD electrode 54, obtains a formation measurement of the geological formation 12 in the drilling fluid 23 comprising OBM or WBM (block 94). For example, the sensor may detect the electrical resistivity of the geological formation using the devices and methods described in detail below.

Unleached PCD materials, such as the PCD 56, contain diamond grains sintered into a matrix with a metal filling pore spaces of the matrix. While the diamond matrix of the PCD 56 itself is insulating, the metal in the pore spaces may be highly conductive. For example, the metal may include cobalt, and the cobalt may be connected throughout the pore space of the PCD 56. This may render the PCD 56 electrically conductive.

PCD materials may also be insulators. Leaching the PCD 56 removes the metal near the surface of the PCD 56 and may leave a layer of voids in the pore spaces among the diamond grains. The layer of voids may be filled with resistive material (e.g. epoxy) to form a permanent insulating layer.

Another form of an electrically insulating PCD is created when the diamond grains are sintered with an insulating solvent-catalyst, such as calcium carbonate ($CaCO_3$) or magnesium carbonate ($MgCO_3$) in place of cobalt. This may produces the PCD 56 with insulating material in the pore spaces. Accordingly, the entire PCD material may be insulating. Thus PCD materials offer new opportunities for electrical applications where robust and durable conductive or insulating electrical components are needed.

Unleached PCD electrodes 54 can measure formation resistivity in both the drilling fluid 23 including conductive water based mud (WBM) and the drilling fluid 23 including non-conductive oil based mud (OBM) and synthetic based mud (SBM) when pressed against the geological formation 12 within the wellbore 26. A series of experiments were performed involving pressing different PDC electrodes pressed against different rock cores while measuring the complex electrical impedance, $Z=Z'+jZ''$, where $Z$ is a complex number with real $Z'$ and imaginary $Z''$ components.

Varying diamond content and diamond grain size distribution of the PCD electrodes 54 may have noticeable effects on electrical properties of unleached PCD materials. The greater the cobalt content, the lower the resistance of the PCD 56. However, any unleached PCD materials formed with cobalt as the solvent-catalyst may provide satisfactory results when tested as the PCD electrodes 54 against rock cores due to resistances of the PCD materials being much lower than a resistance of the rock cores. Conversely, leached PCD 56 with epoxy back filled into a leached surface layer had dramatic effects as the non-conductive surface layer may have much a higher resistance than the rock cores. Accordingly, the leached PCD material may essentially operate as an electrical insulator.

Further, an unleached PCD electrode 54 may operate equally well when copper is used as the solvent-catalyst in transmitting electrical current into the drilling fluids 23 of varying salinity of WBM. There is essentially no contact impedance between an unleached PCD and WBM. On the other hand, contact impedance may occur at an interface between two media having different current carriers.

Figure 5:
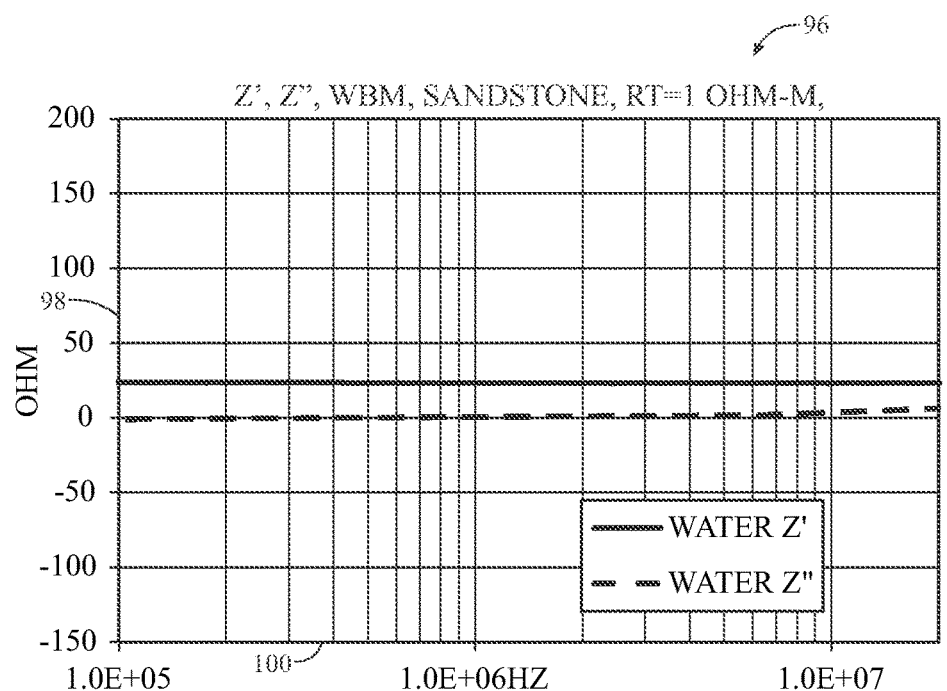
FIG. 5 is a graph of a measured complex impedance for a geological formation with a known resistivity using water based mud within a wellbore when measured by the PCD electrode of FIG. 2, in accordance with an embodiment.

With the foregoing in mind, FIG. 5 depicts a graph 96 of a measured complex impedance 98 for a 3 inch diameter by 2 inch thick sandstone core with resistivity of Rt=1 ohm-m and coated with WBM when measured by the PCD electrode 54. The impedance data is plotted over the frequency range 100 of 100 kHz to 20 MHz. The real part of the complex impedance 98 (represented as a solid line) has an average value and standard deviation of Z'=23.5±0.2 ohms over the entire frequency range. The average value and standard deviation of the imaginary part of the complex impedance 98 (represented by a dashed line) is Z"=0.5±0.2 ohms, which is essentially no reactance within experimental accuracy.

Figure 6:
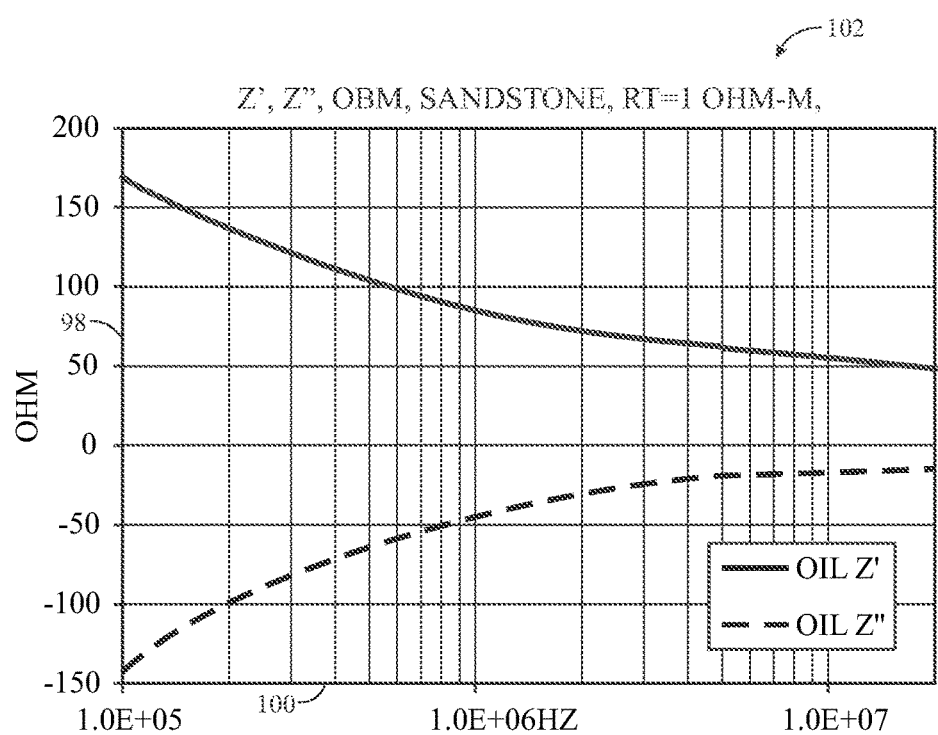
FIG. 6 is a graph of a measured complex impedance for the geological formation of FIG. 5 using oil based mud within the wellbore when measured by the PCD electrode of FIG. 2, in accordance with an embodiment.

In an OBM environment, FIG. 6 depicts a graph 102 of the measured complex impedance 98 for the same sandstone core described above in FIG. 5. With the OBM coating the sandstone core, an interface between the PCD electrode 54 and the sandstone core provides a complex impedance in series with the core resistance R. This interface impedance may be treated as a resistor Re and a capacitor Ce in parallel. It may result in a measured impedance to become complex, as illustrated.

The same rock core is used in both FIGS. 5 and 6. Accordingly, the difference between FIGS. 5 and 6 is the type of mud surrounding the core (i.e., WBM vs. OBM). Real parts (represented by a solid line) and imaginary parts (represented by a dashed line) of the impedance are larger in the OBM than in the WBM, and the real parts and the imaginary parts also have strong frequency dependencies. As shown in FIG. 6, the interface impedance is more pronounced at lower frequencies. Accordingly, higher frequencies may result in a reduced effect from the interface impedance. For example, at 100 kHz, the real part Z' with OBM is approximately seven times the value with WBM. While at 20 MHz, the real part Z' with OBM is approximately double the value with WBM. Similar complex behavior may be found for other rock cores of different materials when the PCD electrode 54 operates in OBM.

Figure 7A:
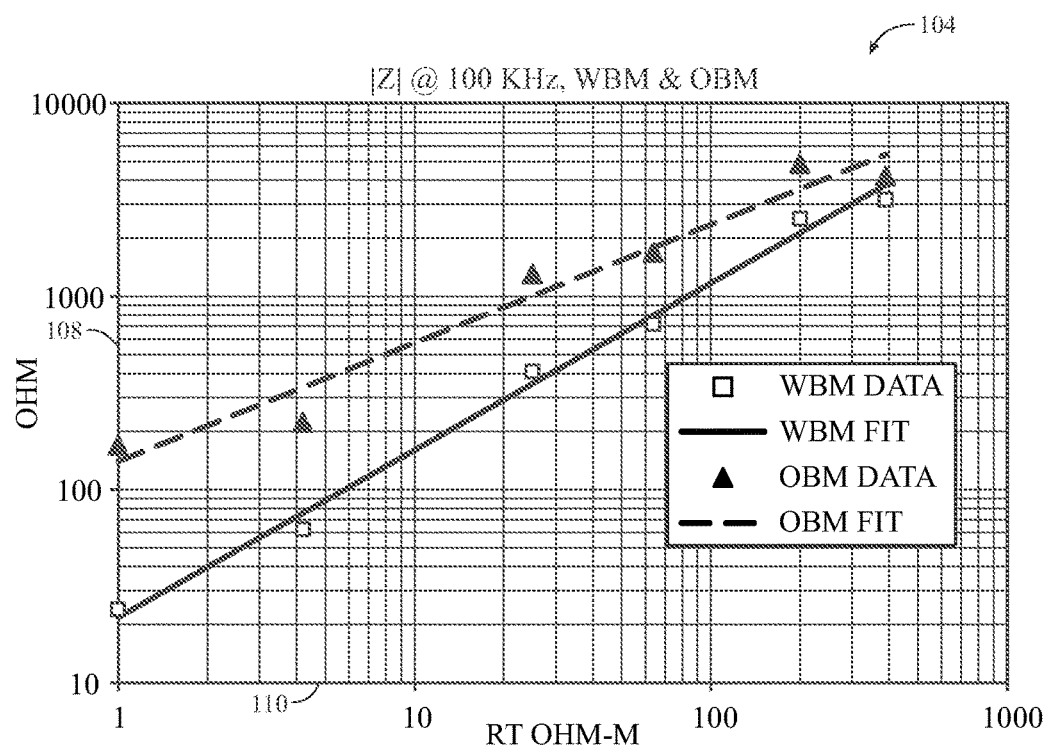
FIGS. 7A and 7B are graphs of impedance magnitudes measured by the PCD electrode of FIG. 2 versus a known formation resistivity for varying rock cores at a 100 kHz frequency and a 10 MHz frequency, respectively, in accordance with an embodiment.
Figure 7B:
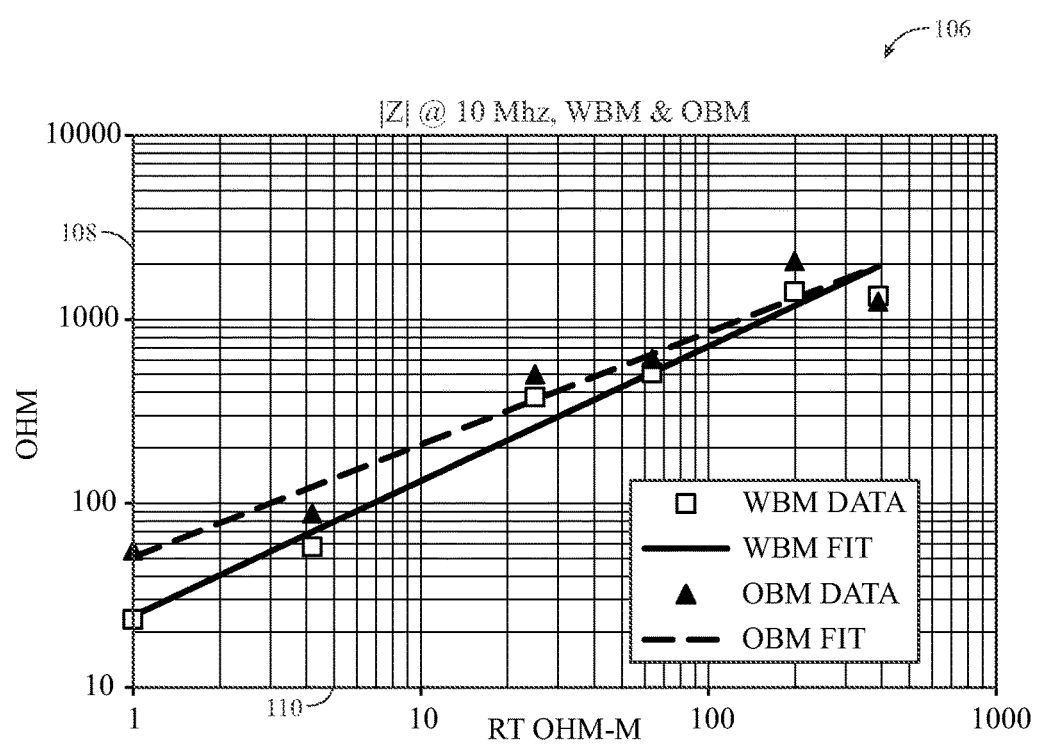

FIGS. 7A and 7B depict graphs 104 and 106, respectively, of an impedance magnitude 108 versus a formation resistivity 110 for six different rock cores. Data is depicted for both WBM (represented by squares) and OBM (represented by triangles) at frequencies of 100 kHz in the graph 104 and 10 MHz in the graph 106. The OBM data has a smaller difference from the WBM data at 10 MHz than at 100 kHz. Accordingly, operating the PCD electrode 54 in OBM in the range of 1 MHz to 10 MHz or higher may provide data that minimizes the effect of the interface impedance.

Additionally, in the graphs 104 and 106, the WBM and the OBM data were least squares fit to a line in a log-log plot represented by the graphs 104 and 106. The graphs 104 and 106 depict a strong correlation between the impedance magnitude 108 and the formation resistivity 110 in both the WBM and the OBM. The monotonic relationships between the impedance magnitude 108 and the formation resistivity 110 may indicate that the PCD electrode 54, when pressed against the wall of the wellbore 26, may be used to measure the formation resistivity in OBM or WBM. The relationships between formation resistivity and impedance, such as the relationships shown as lines in the graphs 104 and 106, may be used to determine formation resistivity from measured impedance. The real part Z' of the complex impedance likewise has a similar relationship to formation resistivity, and may be used in place of the magnitude. In addition, the measured impedance may be used to generate an electrical image of the geological formation 12 and the wall of the wellbore 26. The electrical image may be generated using differences in measurements of the impedance magnitude 108, rather than from absolute value measurements of the formation resistivity 110.

Additionally, it may be appreciated that a force placed on the PCD electrode 54 firmly against the wall of the wellbore 26 may be at or above 24 psi. At this pressure, readings of the PCD electrode 54 become stable. This may indicate that the 24 psi pressure enables adequate contact between the conductive portions of the PCD electrode 54 (i.e., the cobalt between the diamond grains) and the wall of the wellbore 26. For example, the force placed on the PCD electrode 54 may be between 20 psi and 130 psi of pressure.

Figure 8:
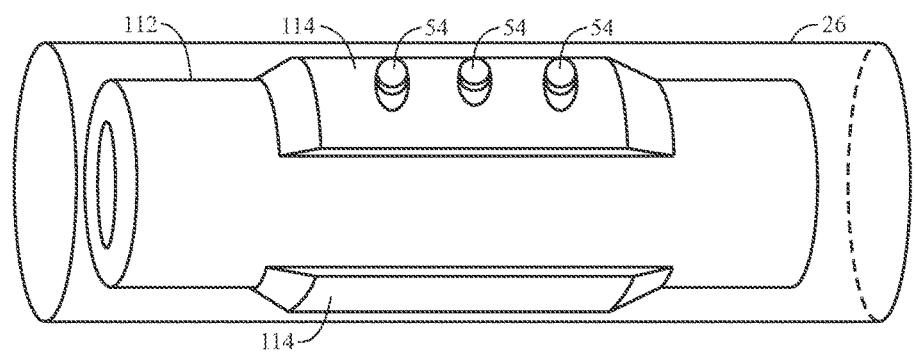
FIG. 8 is a side view of a drill collar on a drill string with the PCD electrodes of FIG. 2 mounted on a stabilizer of the drill collar, in accordance with an embodiment.

With the foregoing in mind, FIG. 8 depicts a side view of a drill collar 112 of the drill string 18 with the PCD electrodes 54 mounted on a stabilizer 114 of the drill collar 112. Additionally, the drill collar 112 is depicted within the wellbore 26. In the illustrated embodiment, a mechanical contact between the PCD electrodes 54 and the geological formation 12 may improve electrical measurements of the formation resistivity 110 in the OBM. As discussed above, the force applied to the PCD electrode 54 may be sufficient to provide constant contact with the geological formation 12, but the force may not be so high as to actually cut into the geological formation 12. Accordingly, the force may be as low as 10 pounds, or the force may be as high as a several hundred pounds.

Additionally, there may be several different methods for applying the electrodes to the borehole wall. Several examples are described below, but other variations may also fall within the scope of the presently disclosed subject matter. For example, FIG. 8 depicts pressure activation of the PCD electrodes 54 to establish the mechanical contact with the geological formation 12. The drill collar 112 may have a 6.75 inch diameter. Further, the stabilizers 114 may have 8.25 inch diameters when mounted on the drill collar 112. Accordingly, this arrangement may be used in the wellbore 26 with an 8.5 inch diameter. A maximum stand-off of the stabilizers 114 may be ¼ inch in an in-gauge wellbore 26. Further, the stabilizers 114 may contain at least one mobile PCD electrode 54. For example, in the illustrated embodiment, three of the PCD electrodes 54 are shown disposed within one of the stabilizers 114.

As the drill collar 112 rotates, the PCD electrodes 54 continuously measure the formation resistivity 110 as a function of an azimuth of the LWD tool 38. The azimuth of the LWD tool 38 may be measured using a magnetometer and the earth's magnetic field, or by an accelerometer and the direction of gravity, for example. Readings of the PCD electrodes 54 may be stored in the memory 48 in a number of azimuthal bins and at different times for processing.

Further, as the wellbore 26 is drilled, the PCD electrodes 54 move along an axis of the wellbore 26 and provide a second dimension to the resistivity data of the geological formation 12. Accordingly, a time during which the azimuthal data is acquired is also stored in the memory 48, rather than a depth position of the PCD electrodes 54. The depth positions of the PCD electrodes 54 are known versus time kept on the surface of the drilling system 10 (e.g., in the data processing system 44), but the depth positions may not be known downhole in the LWD tool 38. Therefore, positions of the PCD electrodes 54 along the wall of the wellbore 26 are constructed by combing resistivity measurements versus the times the measurements occurred from the LWD tool 38 along with a depth versus time provided by at the surface of the drilling system 10. Such azimuthal measurements may be used to form an image of the geological formation 12 and the wall of the wellbore 26. Such images are useful in identifying the geology, and are used to guide trajectory of the wellbore 26.

Figure 9:
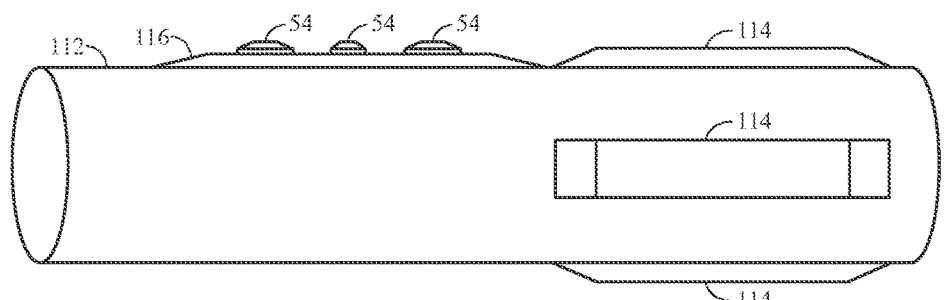
FIG. 9 is a side view of a drill collar along with the PCD electrodes of FIG. 2 mounted on an upset of the drill collar, in accordance with an embodiment.

In another embodiment, FIG. 9 depicts a side view of the drill collar 112 along with several of the stabilizers 114. Additionally, the PCD electrodes 54 are mounted on a separate upset 116 of the drill collar 112. In this embodiment, the upset 116 has an outer radius of 4 inches, and the stabilizers 114 have diameters of 8.25 inches. Accordingly, the upset 116 is at least $\frac{1}{8}^{th}$ of an inch from the geological formation 12 due to the 8.25 inch diameter stabilizers 114. A maximum distance from the upset 116 to the geological formation 12 would be $\frac{3}{8}^{th}$ of an inch in an 8.5 inch diameter wellbore 26. The 8.25 inch stabilizers 114 may prevent the upset 116 from being in direct contact with the geological formation 12, since a face of the upset 116 is on an 8 inch diameter. However, the PCD electrodes 54 may move in and out of the upset 116 so as to establish contact with the geological formation 12.

Figure 10:
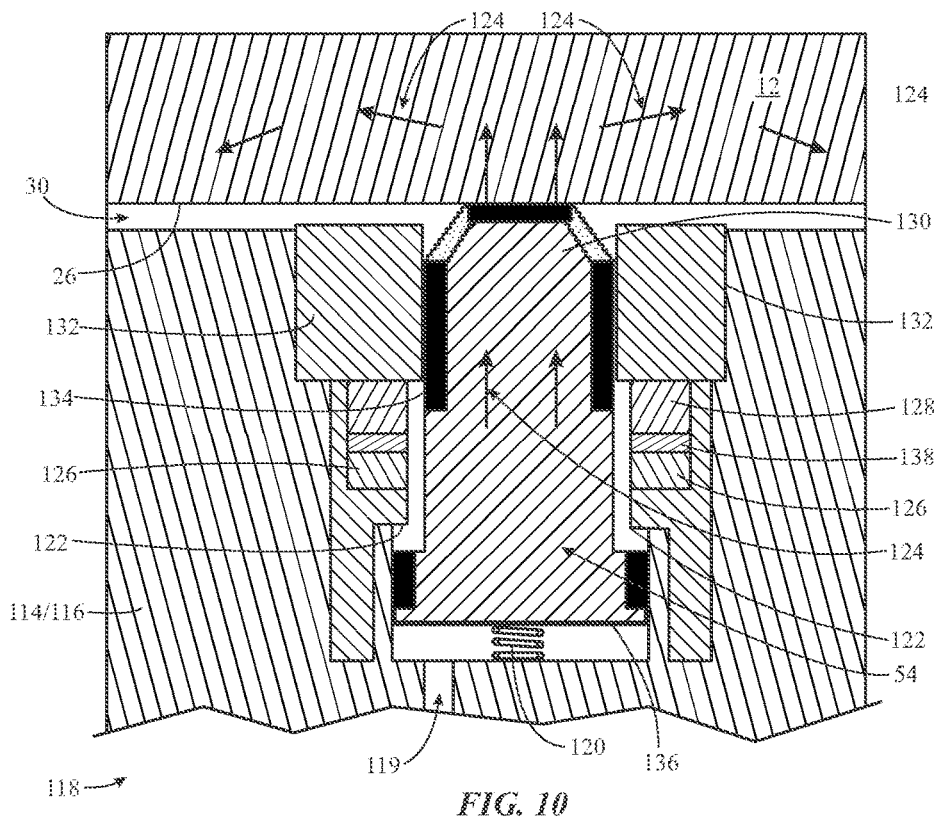
FIG. 10 is a cross-sectional view of an example of the PCD electrode of FIG. 2 which could be mounted in the stabilizer of FIG. 8 or the upset of FIG. 9, in accordance with an embodiment.

A cross-sectional view of an example of the PCD electrode 54, which could be mounted in the configurations of FIGS. 8 and 9, is depicted in FIG. 10. The PCD electrode 54 is pressed against the geological formation 12 by a pressure differential between an interior 118 of the drill collar 112 and the annulus 30. When the drilling fluid pump 22 is on, a pressure inside the drill collar 112 is greater than the pressure in the wellbore 26 due to a pressure drop through the drill bit 20. Thus, the PCD electrode 54 is pressed against the surface of the wellbore 26 while drilling because of pressure applied to the PCD electrode 54 from the drilling fluid 23 under pressure entering a hole 119 in the drill collar 112. When the drilling fluid pump 22 is off, the PCD electrodes 54 are neutral or could be retracted by a spring 120. Additionally, mechanical stops 122 may prevent the PCD electrodes 54 from moving too far into the wellbore 26 when the drilling fluid pump 22 is activated.

Further, a current 124 flows through the PCD electrode 54 and into the geological formation 12. The current 124 is created by a transmitting toroidal transformer 126 and measured by a measure toroidal transformer 128. In the illustrated embodiment, the toroidal transformers 126 and 128 are rigidly mounted in the drill collar 112 and do not move as the PCD electrode 54 strokes in and out of the stabilizer 114 or the upset 116. Accordingly, there are no stresses placed on the toroidal transformers 126 and 128, their windings, or their feed wires due to the motion of the PCD electrode 54. While the illustrated embodiment of FIG. 10 discloses the use of the toroidal transformers 126 and 128, it may be appreciated that a wire attached to the PCD electrode 54 is also conceived for transmitting and receiving the current 124.

Additionally, an upper portion 130 of the PCD electrode 54 may be insulated from the drill collar 112. Insulation may be a tube 132 surrounding the PCD electrode 54, attached to a pad of the stabilizer 114 or upset 116, or attached to the PCD electrode 54. Further, an insulating layer 134 of leached PCD material may coat the PCD electrode 54 to provide additional insulation from the drill collar 112. A base 136 of the PCD electrode 54 may be grounded by metal-metal contact and/or by the spring 120. A circuit may be closed by the current 124 returning through the body of the drill collar 112 to the base 136 of the PCD electrode 54.

Due to close proximity of the toroidal transformers 126 and 128, there may be a small shield 138 placed between the two toroidal transformers 126 and 128 to prevent any direct electric or magnetic coupling between them. The shield 138 may be metallic, and the shield 138 may also have a high magnetic permeability to prevent stray magnetic fields from the transmitting toroidal transformer 126 from coupling with the measure toroidal transformer 128.

Figure 11:
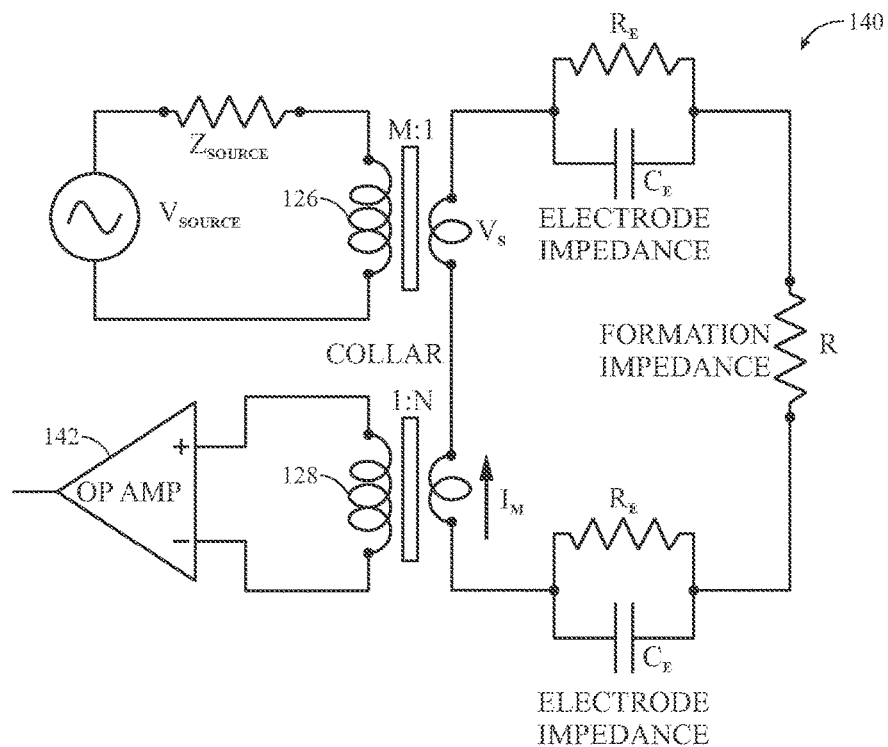
FIG. 11 is a schematic circuit diagram for a formation resistivity measurement of a geological formation using the PCD electrode of FIG. 10, in accordance with an embodiment.

With this in mind, FIG. 11 is a schematic circuit diagram 140 for the measurement of the formation resistivity of the geological formation 12 with the PCD electrode 54 configuration depicted in FIG. 10. A voltage is generated across the PCD electrode 54 by the transmitting toroidal transformer 126, which surrounds a body of the PCD electrode 54. The toroidal transformer 126 may include a ring of magnetic material (e.g. ferrite) with M wire turns. Additionally, the body of the PCD electrode 54 may function as one turn. Hence, the toroidal transformer 126 surrounding the PCD electrode 54 may operate as an M:1 turn source transformer. A radio-frequency (RF) voltage source, Vsource, with source resistance, Zsource, may drive the toroidal transformer 126. Generally, operating frequencies may be in the range of 100 kHz to 100 MHz. Accordingly, current in the windings of the toroidal transformer 126 produces a voltage drop, Vs, across a length of the PCD electrode 54. The current delivered to the toroidal transformer 126 is known, and the mutual inductance for the M:1 transformer is also known. Hence, the voltage drop across the PCD electrode 54, Vs, is known.

A current, Im, flows from a face of the PCD electrode 54 into the geological formation 12. Subsequently, the current Im returns to the drill collar 112 via another contact point, for example through the stabilizer 114. A measure toroidal transformer 128 may also surround the PCD electrode 54, and the toroidal transformer 128 may measure an amount of current, Im, that is injected into the formation. In this case, the toroidal transformer 128 is a 1:N turn transformer, where N is the number of wire turns of the toroidal transformer 128. An operational amplifier 142 may be used to boost a measure signal received by the measure toroidal transformer 128. Additionally, the current Im may depend on the formation resistivity, a shape of the PCD electrode 54, other geometric factors, and the presence of OBM within the wellbore 26.

A complex impedance may calculated from the measurements of the measure toroidal transformer 128 by the equation: Z=K*Vs/Im where K is a constant depending on the geometry and circuit details of the PCD electrode 54. Since the voltage drop Vs and injected current Im are known, the complex impedance Z=Z'+jZ" of the PCD electrode 54 and the geological formation 12 may be determined. In OBM, the interface impedance can be represented by a resistor Re and a capacitor Ce in parallel. The interface impedance of the PCD electrodes 54 and current return have been combined in this model. Generally, the resistor Re and capacitor Ce will be functions of frequency. The formation can be represented by a resistor R in series with the interface impedances. At a very high frequency range (e.g, greater than 20 MHz), and at very high formation resistivities (e.g., greater than 100 ohm-m), the geological formation 12 may also have small dielectric effects, which may be taken into account, if desired. Subsequently, $Z=Z'+jZ''$, $Z'$, and/or $|Z|$ may be used to deduce the formation resistance R. A geometrical factor may relate the formation resistivity Rt to the formation resistance R, where the geometrical factor is a known constant.

Further, an alternative circuit approach is to use just one toroidal transformer for both source and measure functions. In this embodiment, the impedance of the toroid is measured, and this measured impedance is used to derive the formation resistivity Rt. This approach may be less sensitive to the formation resistivity Rt than the two toroid approach discussed above.

Figure 12:
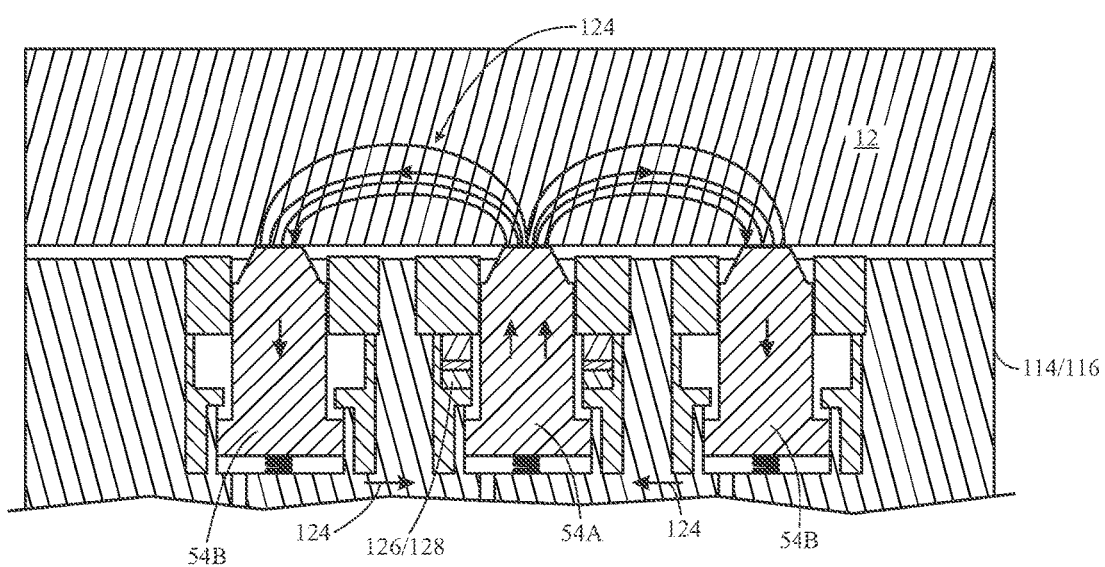
FIG. 12 is a cross-sectional view of a three-electrode configuration of a logging while drilling (LWD) tool, in accordance with an embodiment.

In another embodiment, a cross-sectional view of a three-electrode configuration is depicted in FIG. 12. In the illustrated embodiment, two outer PCD electrodes 54B are return points for the current 124, while a central PCD electrode 54A provides the current 124 into the geological formation 12. This configuration provides that a location where the current 124 returns remains in close proximity to the PCD electrode 54A with the measure toroidal transformer 128. The outer PCD electrodes 54B do not contain toroids or wires, but the PCD electrodes 54B are grounded to the drill collar 112 and/or the stabilizer 114 or the upset 116 by metal-metal contact and/or by springs. It may be noted that while the PCD electrodes 54A and 54B are illustrated as a single block of material, other configurations of the PCD electrode 54 described herein are conceived for use within the three-electrode configuration or any other electrode configuration disclosed herein.

Figure 13:
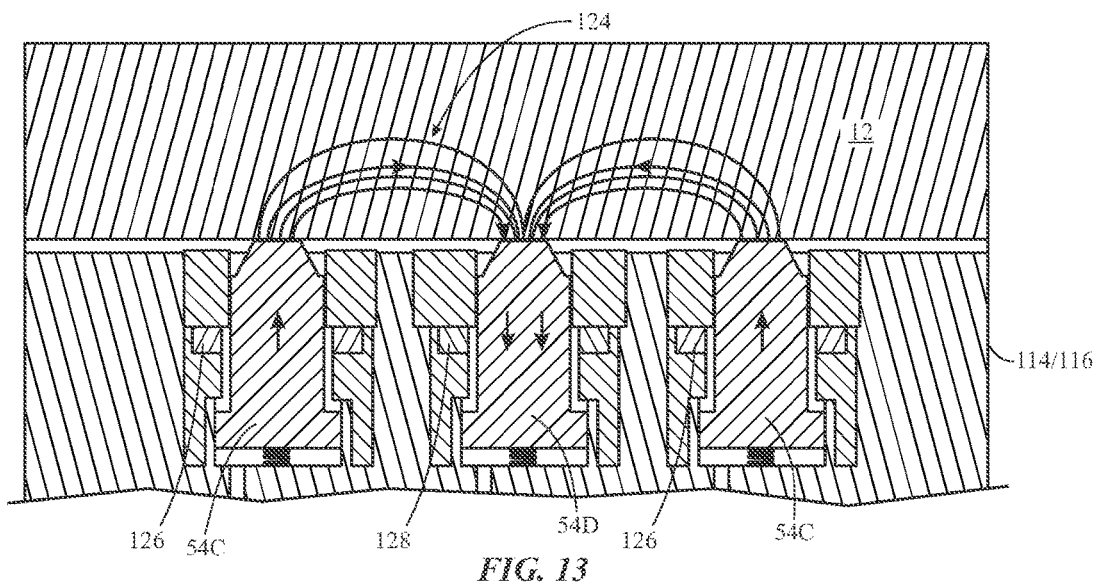
FIG. 13 is a cross-sectional view of an alternative configuration of the three-electrode LWD tool of FIG. 12, in accordance with an embodiment.

In another configuration, a cross-sectional view of a different three-electrode configuration is depicted in FIG. 13. Two outer PCD electrodes 54C are current sources and a central PCD electrode 54D may measure the induced current 124. The two outer PCD electrodes 54C include transmitting toroidal transformers 126 that are driven in phase to produce equivalent voltage drops to each other. The outer PCD electrodes 54C inject the current 124 into the geological formation 12, which returns via the central PCD electrode 54D. The central PCD electrode 54D may include the measure toroidal transformer 128. Separating the transmitting toroidal transformers 126 and the measure toroidal transformers 128 may limit spurious coupling between the toroidal transformers 126 and 128.

Figure 14A:
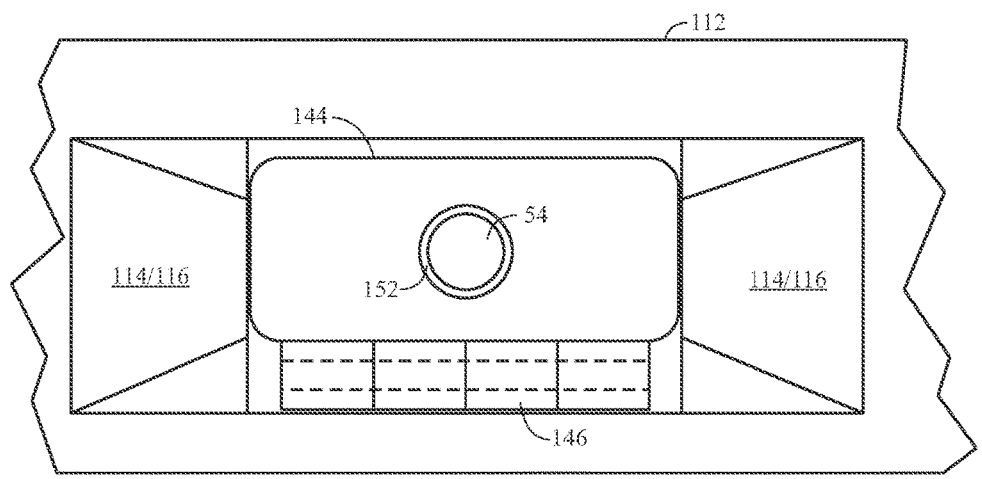
FIG. 14A is a top view of an embodiment of the PCD electrode of FIG. 2 and a return electrode, in accordance with an embodiment.

An alternative configuration to the three-electrode configurations of FIGS. 12 and 13 is provided in a top view of an embodiment of the PCD electrode 54 and a return electrode 144 depicted in FIG. 14A. The PCD electrode 54 is similar to the PCD electrode 54A of FIG. 12, but the two outer PCD electrodes 54B are replaced by a hinged pad (i.e., the return electrode 144). The return electrode 144 may be coupled to the stabilizer 114 or the upset 116 via a hinge 146.

Figure 14B:
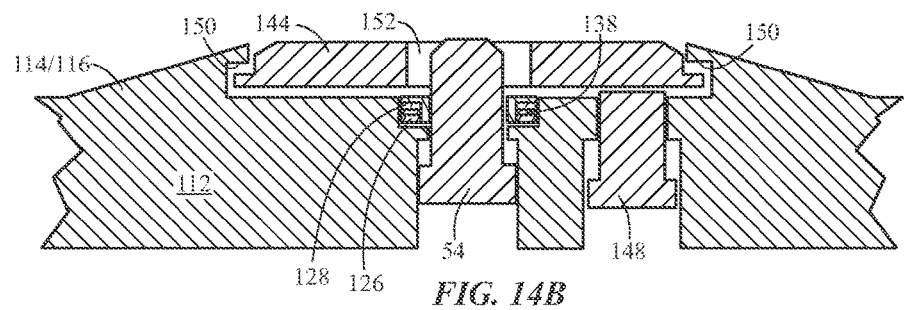
FIG. 14B is a cross-sectional view of the PCD electrode and the return electrode of FIG. 14A, in accordance with an embodiment.

Additionally, FIG. 14B depicts a cross-sectional view of the PCD electrode 54 and the return electrode 144. The return electrode 144 includes the hinge 146 and a hydraulic piston 148. Further, stops 150 within the stabilizer 114 or the upset 116 may prevent the return electrode 144 from extending too far away from the drill collar 112. A taper of the stabilizer 114 or the upset 116 may also enable the pad to collapse when entering or exiting the wellbore 26 while the pressure differential is zero.

Moreover, a central portion of the return electrode 144 may include an opening 152 to permit the PCD electrode free movement. Movement of both the return electrode 144 and the PCD electrode 54 may be individually activated.

Additionally, the return electrode 144 may be grounded to the drill collar 112 via the hinge 146, for example. In this configuration, the PCD electrode 54 has both the transmitting toroidal transformer 126 and the measure toroidal transformer 128. Additionally, conductive PDC cutters or other PCD material may be mounted on the return electrode 144 to reduce wear and to provide contact with the geological formation 12.

Figure 15:
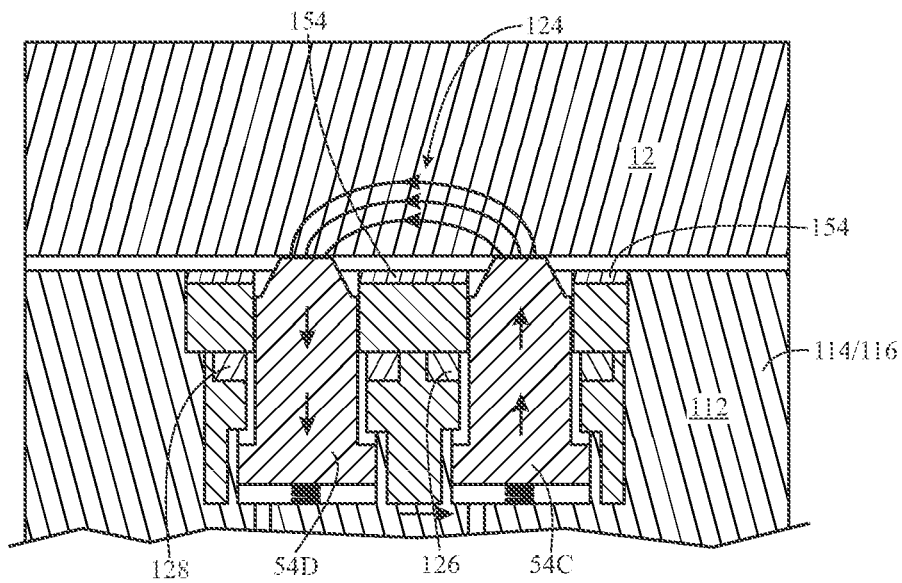
FIG. 15 is a cross-sectional view of a two-electrode configuration of an LWD tool, in accordance with an embodiment.

FIG. 15 depicts a cross-sectional view of a two-electrode configuration. The PCD electrode 54C is positioned within the transmitting toroidal transformer 126, and the PCD electrode 54D is positioned within the measure toroidal transformer 128. A volume of the geological formation 12 that is located between the two PCD electrodes 54C and 54D is measured. Accordingly, an image pixel is approximately a center-to-center distance between the electrodes by the width of the PCD electrodes 54C and 54D. Additionally, the two PCD electrodes 54C and 54D may be aligned parallel or perpendicular to an axis of the drill collar 112. In some embodiments, there is an asymmetric response to OBM filled fractures. If the fracture is perpendicular to the current 124 flow between the two PCD electrodes 54C and 54D, then the fracture may block the current 124. If the fracture is parallel to the current 124 flow, then there will be very little effect. Both fracture orientations can be measured if there are two pairs of electrodes. For example, one pair may be aligned with the axis of the LWD tool 38, and the other pair aligned perpendicular to the axis of the LWD tool 38. Optionally, a surface surrounding the two PCD electrodes 54C and 54D may be insulated by insulator 154 to minimize the current 124 returning directly to the stabilizer 114 or the upset 116.

Figure 16:
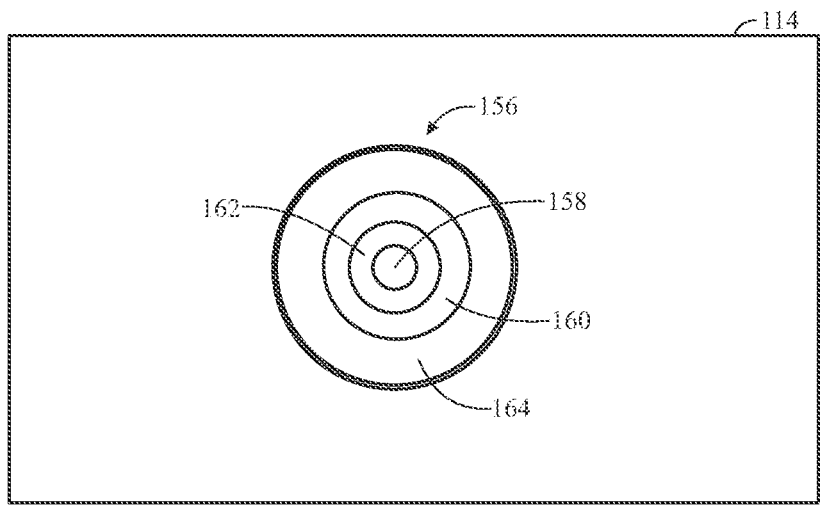
FIG. 16 is a top view of a single-probe configuration of an LWD tool, in accordance with an embodiment.

FIG. 16 depicts a top view of a single-probe configuration. A probe 156 is depicted refracted and flush with a face of the stabilizer 114. Further, the probe 156 may be mounted in a blade of the stabilizer 114, or the probe 156 may be mounted in the upset 116 or any other conceivable portion of the drill collar 112. The two electrodes consist of a central button electrode 158 and a concentric annular ring electrode 160. A face of the central button electrode 158 may be an unleached PCD disk attached to a tungsten carbide rod, for example. The concentric annular ring electrode 160 may be formed by a metal body of the probe 156, which may be tungsten carbide. Further, the concentric annular ring electrode 160 may have an unleached PCD face brazed onto the metal body of the probe 156. Furthermore, the concentric annular ring electrode 160 may be PCD material brazed onto the tungsten carbide of the metal body of the probe 156. The central button electrode 158 may be insulated from the concentric annular ring electrode 160 by an insulating material 162. The insulating material 162 at a face of the probe 156 may be leached PCD material for abrasion resistance, or the insulating material 162 may be the PCD 56 made with a CaCO3 solvent-catalyst.

Additionally, the probe 156 may also include a chamfered surface 164. The chamfered surface 164 may enable the probe 156 to be pushed inwards toward the stabilizer 114 by changes in the diameter of the wellbore 26, specifically in case of a sudden tangential contact. Further, a maximum stroke of the PCD electrode 54 may generally be equal to a height of the chamfered surface 164. This may prevent the PCD electrode 54 from hanging-up in the wellbore 26 with a rugose surface. For example, assume that the maximum stroke of the PCD electrode 54 is 0.5 inches and an angle of the chamfered surface 164 is 45 degrees. If a desired contact area is 0.5 inches in diameter, then a diameter of the PCD electrode 54 will be twice a height of the chamfered surface 164 plus the diameter of the contact area, for example, 3×0.5=1.5 inches. Hereinafter, the probe 156 of this particular configuration may be referred to as the button design probe 156.

Figure 17:
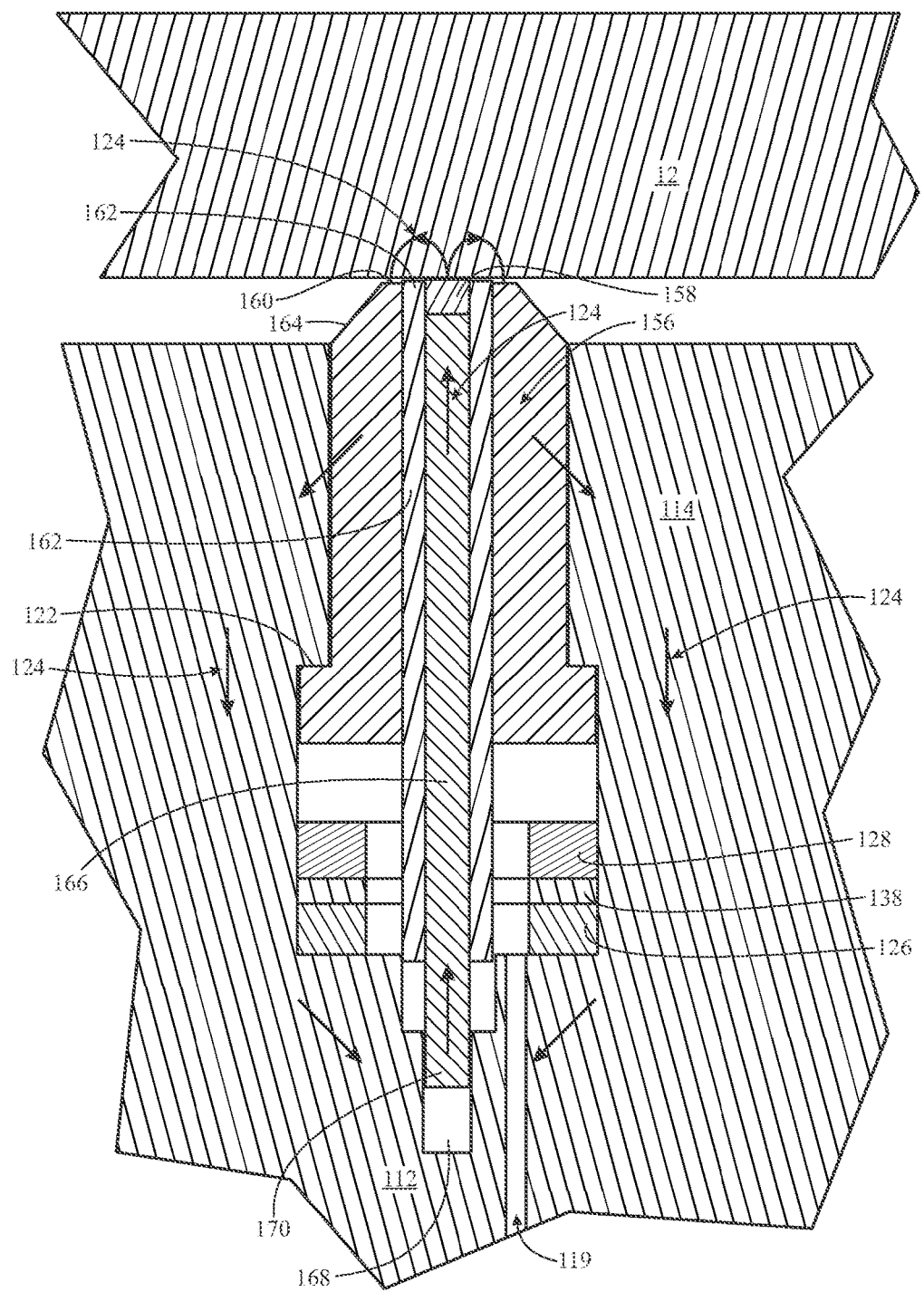
FIG. 17 is a cross-sectional view of the button design probe pressed against the geological formation, in accordance with an embodiment.

Additionally, FIG. 17 depicts a cross-sectional view of the button design probe 156 pressed against the geological formation 12. An activation force to press the button design probe 156 against the geological formation 12 may be provided by the pressure drop across the drill bit 20, as previously described. The central button electrode 158 may be attached to a conductive rod 166, which protrudes through the measure toroidal transformer 128, the shield 138, and the transmitting toroidal transformer 126, and into a hole 168 in the drill collar 112. The rod 166 may have the insulating material 162 over much of a length of the rod 166. In particular, the insulating material 162 may extend through a region containing the toroidal transformers 126 and 128. Below the toroidal transformers 126 and 128, the rod 166 may establish electrical contact with material of the drill collar 112. The electrical contact may simply be metal-metal, or a spring 120 may also be used. The body of the button design probe 156, containing the concentric annular ring electrode 160, makes electrical contact with the stabilizer 114 and/or the drill collar 112, also by metal-metal contact and/or by springs 120. An outer surface of button design probe 156 may contain unleached PCD for a low coefficient of friction while maintaining solid electrical contact with the stabilizer 114. As in previously described embodiments, there may be a stop 122 to limit radial movement, the chamfered surface 164 on the button design probe 156, and the hole 119 for the mud to activate the button design probe 156.

Further, a path the current 124 travels is depicted in FIG. 17. With the button design probe 156 pressed against the geological formation 12, the two electrodes 158 and 160 establish electrical contact with the geological formation 12. The current 124 is injected into the geological formation 12 by the central button electrode 158, and the current 124 returns via the concentric annular ring electrode 160. There may be a well-defined volume of current in front of the button design probe 156. The current 124 flows radially from the central button electrode 158 to the concentric annular ring electrode 160. Accordingly, an image pixel may be approximately the size of the concentric annular ring electrode 160, which may provide very high resolution. Further, the current 124 flows from the concentric annular ring electrode 160 into the body of the button design probe 156, into the drill collar 112 or the stabilizer 114, and onto a lower portion 170 of the rod 166 coupled to the central button electrode 158, thus completing a circuit.

Additionally, the insulating material 162 around the rod 166 may prevent the current 124 from flowing into a region including of the toroidal transformers 126 and 128. This region may contain drilling mud due to the activation function operated by the pressure differential of the drilling fluid 23. In insulating OBM, the insulating material 162 may not provide any additional insulating effect. In WBM, however, the insulating material 162 may prevent currents in the drilling fluid 23 from shorting a measurement by the toroidal transformers 126 and 128. Thus, the button design probe may be operated in WBM as well as in OBM and SBM.

Figure 18:
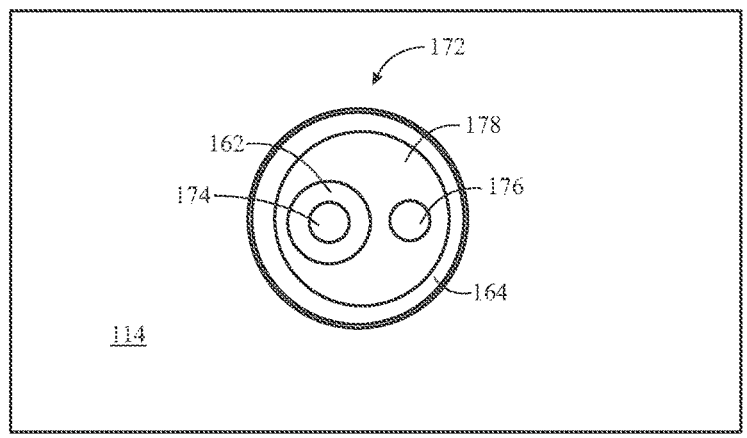
FIG. 18 is a top view of a probe where a source electrode and a return electrode are both PCD disks, in accordance with an embodiment.

In another variation of a single-probe configuration, FIG. 18 depicts a top view of a probe 172 where a source electrode 174 and a return electrode 176 are both PCD disks. The source electrode 174 is positioned off-center of a metal body 178 of the probe 172. This provides space for the return electrode 176, which may be brazed onto a face of the metal body 178.

Figure 19:
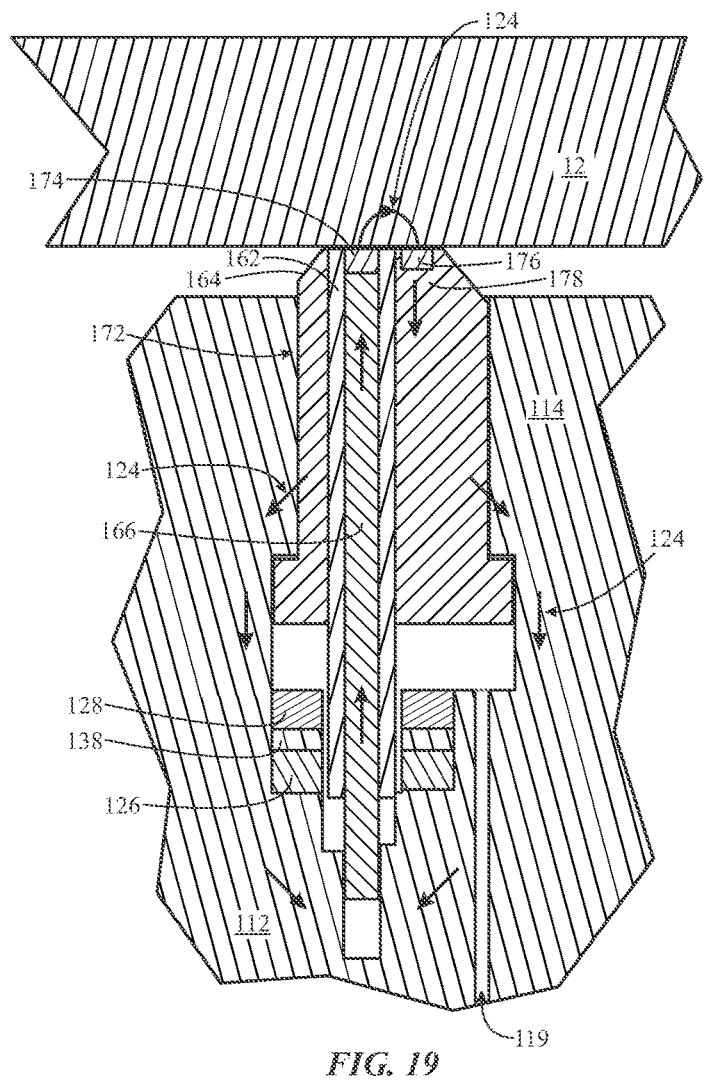
FIG. 19 is the probe of FIG. 18 with a current flowing along an axis from the source electrode to the return electrode of FIG. 18, in accordance with an embodiment.
Figure 20:
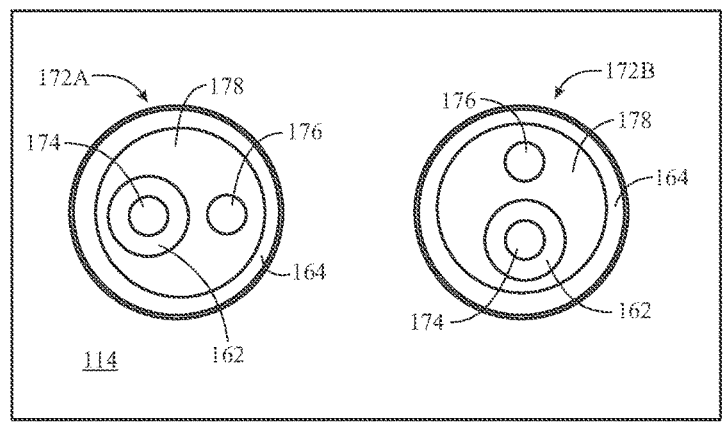
FIG. 20 is a top view of an LWD tool with two probes of the probes of FIG. 18, in accordance with an embodiment.

The probe 172 may operate in a similar manner to the button design probe 156 except that the current 124 is no longer radial. FIG. 19, for example, depicts the probe 172 with the current 124 flowing along an axis, which connects the two electrodes 174 and 176. The configuration of the probe 172 may detect OBM filled fractures in the geological formation 12 that are transverse to the axis connecting the two electrodes 174 and 176. For example, a top view of an LWD tool 38 with two probes 172A and 172B is depicted in FIG. 20. The two probes 172A and 172B are oriented in perpendicular directions. Such orientation may enable detection of most of the OBM filled fractures.

Figure 21:
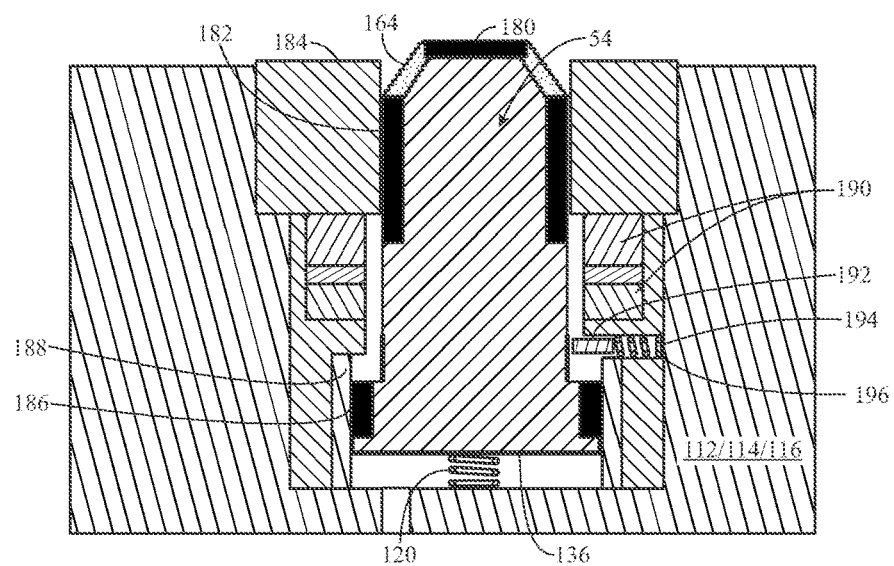
FIG. 21 is a cross-sectional view of the PCD electrode of FIG. 2 including a grounding pad, in accordance with an embodiment.

FIG. 21 depicts a cross-sectional view of an additional embodiment of the PCD electrode 54. The PCD electrode 54 should be electrically conductive, which enables the current 124 to pass from the drill collar 112, the stabilizer 114, or the upset 116 to a face 180 of the PCD electrode 54 and into the geological formation 12 (not shown). The current 124 may return to the drill collar 112 via an additional contact between the geological formation 12 and the drill collar 112 (e.g. via the stabilizer 114) or via some other elements (e.g., other PCD electrodes 54). For the button design probe 156, a current return is may be defined by the concentric annular ring electrode 160. For the probe 172 described in FIGS. 18-20, the current return may also be defined by the return electrode 176.

The face 180 of the PCD electrode 54 may be made of wear-resistant material, as it is forced against the geological formation 12 within the wellbore 26 while the drill collar 112 rotates. The face 180 may be made of unleached PCD, for example. The face 180 may also be made from other wear resistant and electrically conductive materials such as tungsten carbide or stellite. The unleached PCD material may combine durability and wear resistance with sufficient electrical conductivity properties. In one embodiment, the face 180 may be spherical with a radius similar to, or slightly smaller than, a radius of the wellbore 26. In another embodiment, the face 180 may be cylindrical with a radius similar to, or slightly smaller than, the radius of the wellbore 26. In such an embodiment, an axis of the face 180 may be parallel to a vertical axis of the drill collar 112. To maintain axial alignment of the PDC electrode 54, a keying system may be used between the electrode and the tool. Additionally, a contact area between the face 180 and the geological formation 12 may determine a size of an image pixel for the PCD electrodes 54 described in the present application. The pixel size may be balanced against a proper contact force to provide adequate electrical contact. For example, as discussed above, the face 180 of the PCD electrode 54 may be rounded to match a curvature of the wellbore 26. Accordingly, the face 180 may maintain adequate electrical contact over the entire face 180 even as the face 180 increases in size.

Furthermore, the face 180 may not be perfectly smooth to avoid pressure lock against the geological formation 12. For example, pressure locking may occur with high hydrostatic pressure when no movement is occurring and a mud cake is soft. These conditions may be similar to the conditions for drill-string differential sticking) The face 180 may be marked with grooves of depth in the range from 0.005 inch to 0.040 inch with spacing in the range of 0.020 inch to 0.080 inch. Other depths and spacings of the grooves on the face 180 are also conceived.

The chamfered surface 164 may be made from wear-resistant material, and the chamfered surface 164 may be electrically insulating. When the PCD electrode 54 slides over the wall of the wellbore 26, a mud cake may accumulate at the chamfered surface 164. The accumulated mud cake may be slightly conductive, even if the OBM is insulating. The mud cake may contain conductive clay particles and/or conductive chemicals form the drilling fluid 23. With a packed mud cake, some current could pass from a conductive chamfered surface 164 into the geological formation 12. Any additional current could slightly enlarge the image pixels. Accordingly, the chamfered surface 164 could be made of an insulating leached PCD material, or of unleached PCD material sintered with a non-conductive solvent-catalyst such as calcium carbonate (CaCO3).

Around an upper cylindrical portion of the PCD electrode 54, the PCD electrode 54 may have an upper mobile guidance surface 182. Additionally, an upper static guidance surface 184 may be positioned on the drill collar 112 or the stabilizer 114. The surfaces 182 and 184 may resist side motion of the PCD electrode 54 resulting from side loads generated by contact of the PCD electrode 54 with the wall of the wellbore 26 while the drill collar 112 rotates. A coefficient of friction between the two surfaces 182 and 184 may be as small as possible to allow the PCD electrode 54 to move smoothly in and out of the stabilizer 114 mounted on the drill collar 112. The two surfaces 182 and 184 may also be highly wear resistant. They may also resist impact of the electrode's face with borehole irregularities.

Accordingly, leached PCD materials may be used to form the surfaces 182 and 184. After leaching out the cobalt, void space in the PCD material may be filled with non-conductive material, such as an epoxy. Another embodiment may use intrinsically insulating PCD material. The intrinsically insulating PCD material may be fabricated with calcium carbonate as the solvent-catalyst in place of cobalt. A third embodiment may use a ceramic material. Additionally, for the button design probe 156, discussed above in FIGS. 16 and 17, the surfaces 182 and 184 may be conductive. Therefore, the surfaces 182 and 184 may be made from tungsten carbide or unleached PCD material.

Additionally, there may be a lower mobile guidance surface 186 on the electrode and a lower static guidance surface 188 on the drill collar 112. The lower guidance surfaces 186 and 188 may operate in addition to the upper guidance surfaces 182 and 184 to align the electrode and enable movement into an out of the drill collar 112 or the stabilizer 114. The lower guidance surfaces 186 and 188 may be wear resistant and have low coefficients of friction. Further, the lower guidance surfaces 186 and 188 are below a toroid assembly 190 to increase a distance between the upper guidance surfaces 182 and 184 and the lower guidance surfaces 186 and 188, which may reduce an impact of the side load. The lower guidance surfaces 186 and 188 may be electrically conductive to provide that the base 136 of the PCD electrode 54 is grounded to the drill collar 112. Accordingly, the lower guidance surfaces 186 and 188 may be made of unleached PCD material, for example. Further, alternative materials may include tungsten carbide, conductive silicon bonded diamond, or stellite. Optionally, the spring 120 might also provide a grounding function between the base 136 and the drill collar 112.

Further, the drilling fluid 23 from an internal portion of the drill collar 112 may be applied on the base 136 of the PCD electrode 54 to generate a force on the PCD electrode 54 against the geological formation 12. No positive seal may be used around the PCD electrode 54. Accordingly, a flow of the drilling fluid 23 around the PCD electrode 54 may occur. Grooves (axial or spiral) may be created on the upper guidance surfaces 182 and 184 to increase flow of the drilling fluid 23 across the surfaces 182 and 184 and into the wellbore 26. In this manner, erosion of the upper guidance surfaces 182 and 184 may be avoided. Further, spiral grooves in the surfaces 182 and 184 may induce rotation of the PCD electrode 54, which may encourage uniform wear on the PCD electrode 54 and also clear filter cake accumulating in front of the PCD electrode 54.

While the base 136 of the PCD electrode 54 may provide a grounding contact for the PCD electrode 54 to the drill collar 112, a grounding pad 192 may also be used to establish the grounding contact. The grounding pads 192 may be pushed against the PCD electrode 54 with a grounding spring 194. The grounding pad 192 and the grounding spring 194 may be engaged in a groove 196 for the grounding pad 192. This may provide that the grounding pad 192 is not dragged along with movement of the PCD electrode 54. The grounding pad 192 may be made of a conductive wear resistant material such as unleached PCD materials, conductive silicon bonded diamond, tungsten carbide, stellite, or a combination of these materials. When made of conductive PCD, a large percentage of metal catalyst may be used (e.g. approximately 20% by volume).

Figure 22A:
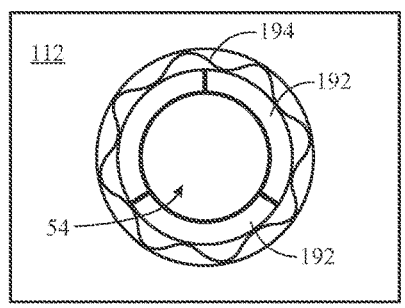
FIG. 22A is a top view of the PCD electrode of FIG. 21 with the grounding pad encircling the PCD electrode, in accordance with an embodiment.
Figure 22B:
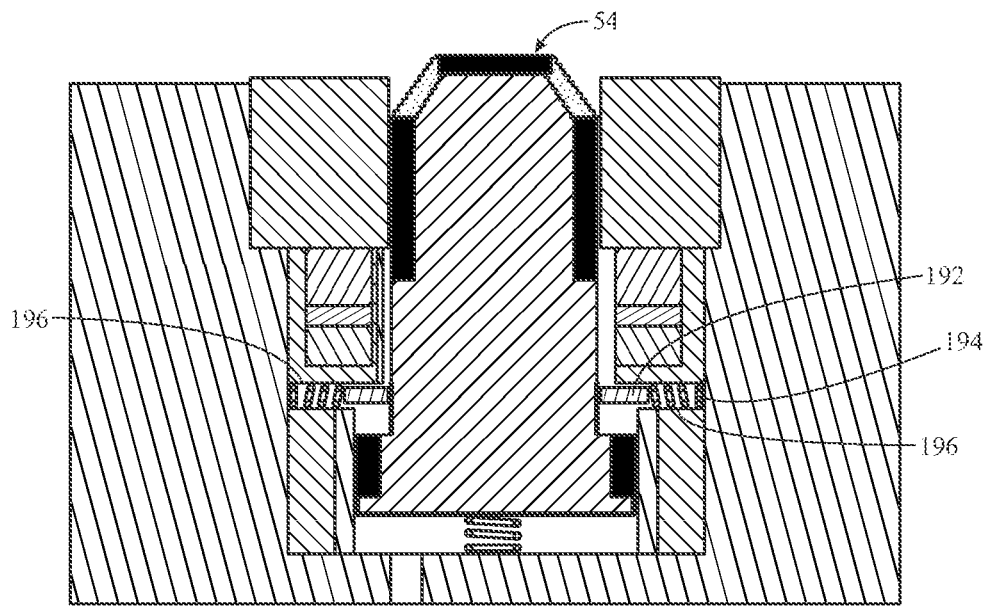
FIG. 22B is a cross-sectional view of the PCD electrode of FIG. 22A, in accordance with an embodiment.

Additionally, the grounding pad 192 may partially encircle the PCD electrode 54, as depicted in FIG. 21, or the grounding pad 192 may substantially encircle the PCD electrode 54, as depicted in FIGS. 22A and 22B. FIG. 22A is a top view of the PCD electrode 54 with the grounding pad 192 substantially encircling the PCD electrode 54. Additionally, the grounding spring 194 is also depicted encircling the grounding pad 192 and the PCD electrode 54. FIG. 22B depicts a cross-sectional view of the PCD electrode 54 shown in FIG. 22A.

Figure 23:
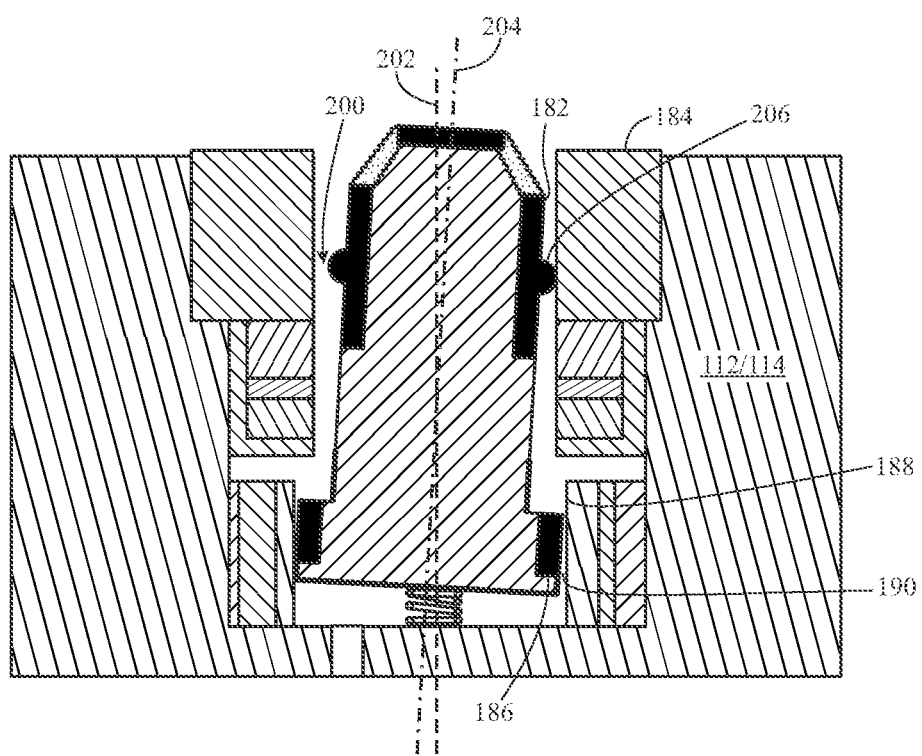
FIG. 23 is a cross-sectional view of a PCD electrode with some misalignment within the drill collar or the stabilizer, in accordance with an embodiment.

In another embodiment, FIG. 23 depicts a cross-sectional view of the PCD electrode 54 with some misalignment within the drill collar 112 or the stabilizer 114. Clearances between the guidance surfaces 182, 184, 186, and 188 are small. The pressure drop may be applied across the lower guidance surfaces 186 and 188, with a gap 198 of between 10 and 100 microns. The upper mobile guidance surfaces 182 and 184 may include a slightly larger gap 200 (e.g. 250 microns). With such tight clearances a configuration of the PCD electrode 54 may be such that the PCD electrode 54 slides with minimal friction, even with some misalignment between the upper and lower guidance surfaces 182, 184, 186, and 188. As depicted, an axis 202 of a hole in the drill collar 112 or the stabilizer 114 may not constantly align with an axis 204 of the PCD electrode 54. Accordingly, to provide minimal friction between the guidance surfaces 182, 184, 186, and 188, lengths of the guidance surfaces 182, 184, 186, and 188 may be limited. For example, in the embodiment depicted in FIG. 23, the upper guidance surface 182 may have a short contact region, such as a ring surface 206 that may encircle a portion of the PCD electrode 54.

Figure 24:
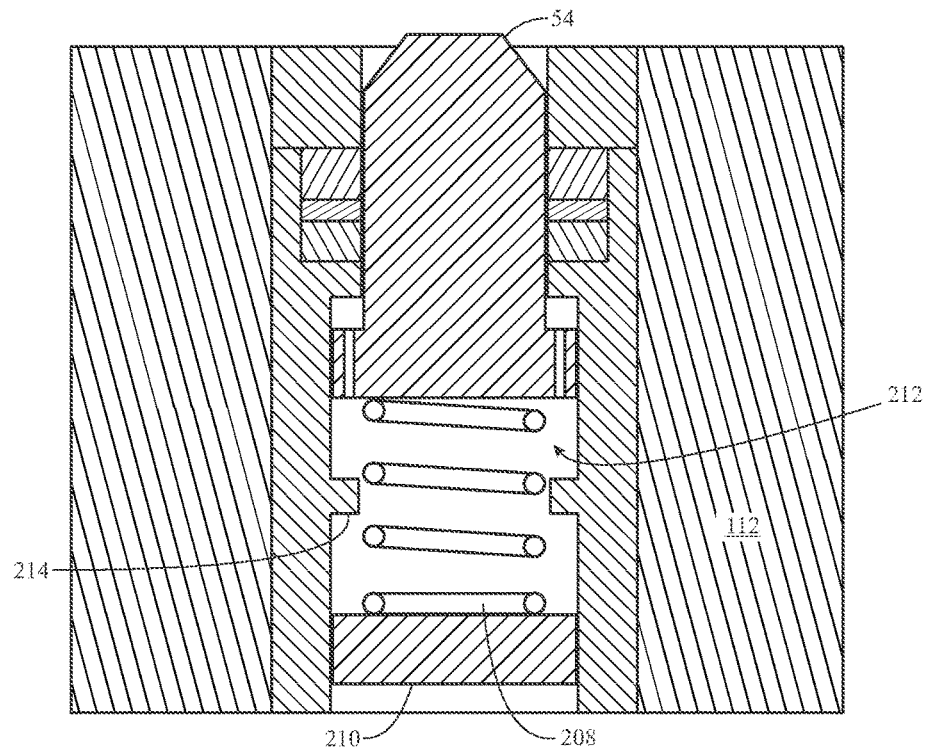
FIG. 24 is a cross-sectional view of a PCD electrode where a radial force is applied to the PCD electrode by a spring, in accordance with an embodiment.

In another embodiment, FIG. 24 depicts a cross-sectional view of the PCD electrode 54 where a radial force is applied by a spring 208 rather than directly by the pressure drop. A piston 210 may be located below the PCD electrode 54 and the spring 208. The piston 210 may have an o-ring seal or it may have a close tolerance with a hole 212 in the drill collar 112. When the drilling fluid pump 22 is off, there is no pressure drop, and the piston 210 is retracted. The spring 208 couples the piston 210 to the PCD electrode 54 such that the PCD electrode 54 is also retracted when the drilling fluid pump 22 is deactivated. Conversely, when the drilling fluid pump 22 is activated, the pressure drop across the piston 210 forces the piston 210 outward until the piston 210 hits a stop 214. Accordingly, the pressure drop across the piston 210 generates a force greater than a force of the spring 208 to activate the piston 210. For example, if the pressure drop is 750 PSI, then a 1 inch diameter piston can create 625 pounds of force, which is likely much larger than the force of the spring 208.

Figure 25:
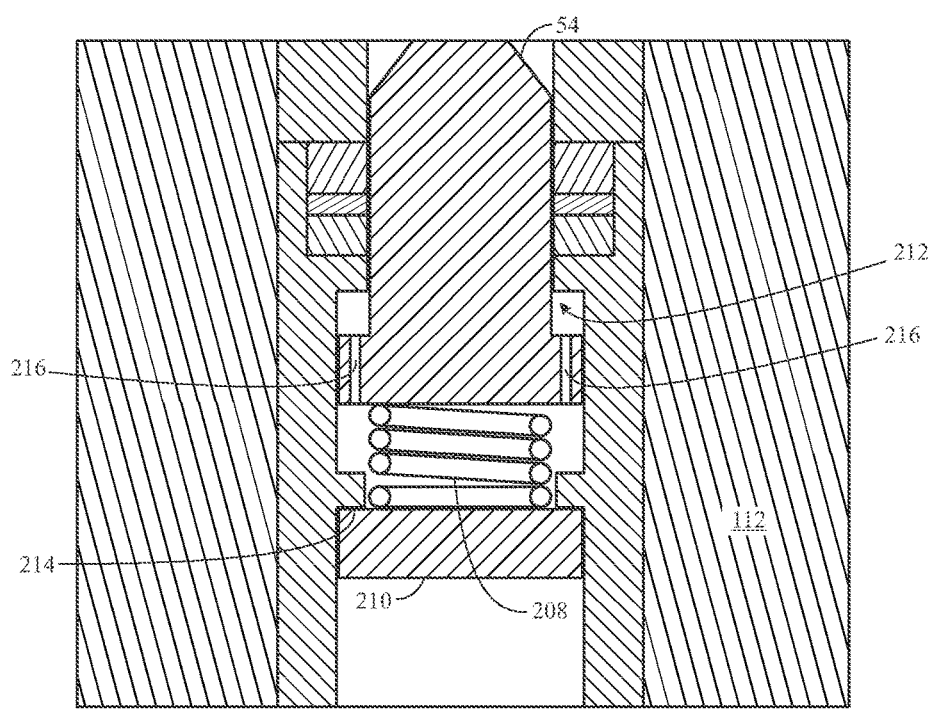
FIG. 25 is a cross-sectional view of the PCD electrode of FIG. 24 when a drilling fluid pump is activated, in accordance with an embodiment.

Referring now to FIG. 25, a cross-sectional view of the PCD electrode 54 is depicted when the drilling fluid pump 22 is activated. The spring 208 is activated by the piston 210, and the spring 208 supplies a radial force to press the PCD electrode 54 against a wall of the wellbore 26. This configuration may provide a defined range of forces under most circumstances because the radial force applied to the PCD electrode 54 may be the force of the spring 208 when the drilling fluid pump 22 is activated. Additionally, vent holes 216 in the PCD electrode 54 may allow the drilling fluid 23 to pass freely into the wellbore 26 without exerting an additional force on the PCD electrode 54.

Figure 26A:
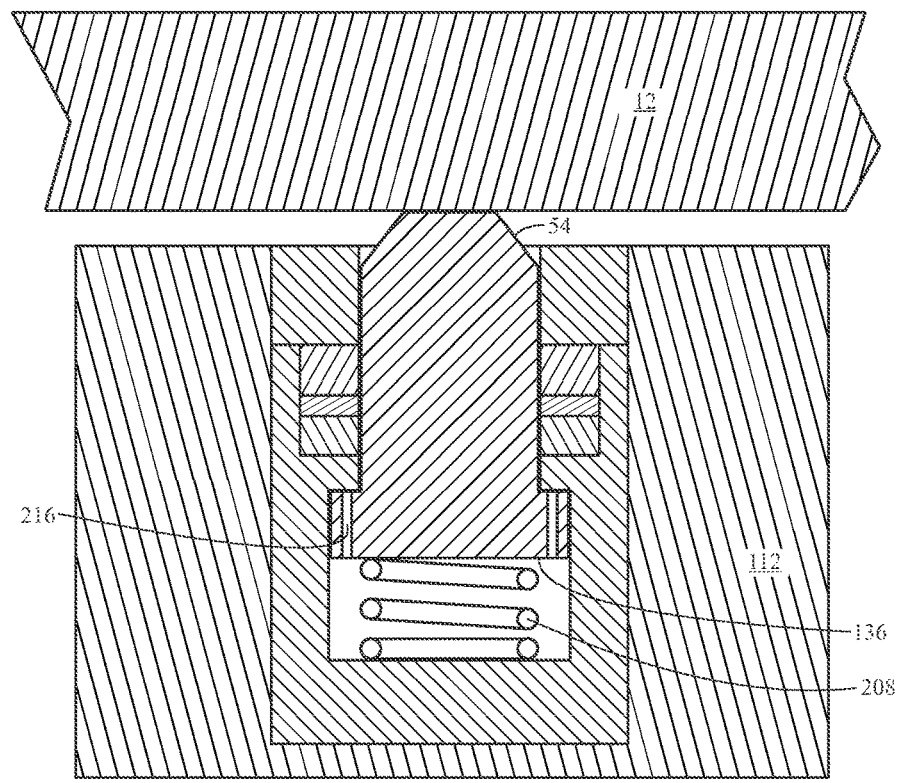
FIGS. 26A and 26B depict cross-sectional views of a PCD electrode where a pressure activation of FIGS. 24 and 25 may be omitted, in accordance with an embodiment.
Figure 26B:
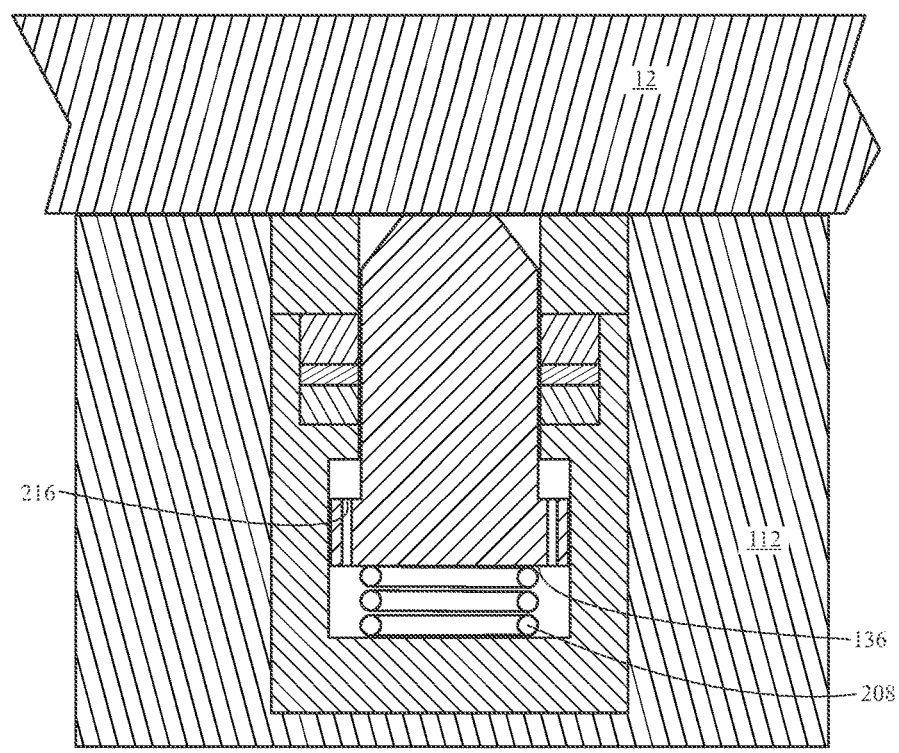

The embodiments described above involve retracting the PCD electrode 54 when the drilling fluid pump 22 is deactivated. This may occur when the PCD electrode 54 is entering or exiting the wellbore 26. However, due to a robust nature of the PCD materials of the PCD electrode 54, retracting the PCD electrode may not be desired in certain situations. For example, FIGS. 26A and 26B depict cross-sectional views of the PCD electrode 54 where the pressure activation described in relation to FIGS. 24 and 25 may be omitted. The PCD electrode 54 may be in a constantly activated configuration by the spring 208. Accordingly, pressure may not be applied to the PCD electrode 54 by the drilling fluid 23. The vent holes 216 may still be provided to equalize a pressure across the base 136 of the PCD electrode 54. As long as a maximum electrode travel distance is not greater than the height of the chamfered surface 164, the PCD electrode 54 may not hang up on a ledge of the wellbore 26 during trips in and out of the wellbore 26.

The spring 208 may exert a force $Fr=k(h_0-h)$ in lb-f, where k is a spring constant in lb-f/inch, $h_0$ is a length of the spring 208 while uncompressed in inches, and h is a length of the spring 208 while compressed. The spring constant for a simple helical spring is given by $k=(Gd^4)/(8\,nD^3)$ where G is a modulus of rigidity, d is a wire diameter, n is a number of turns, and D is an outside diameter of the spring 208. For stainless steel, $G=3*10^7$ PSI. For example, let d=0.1 inch, D=1.5 inch, and n=8, then k=70 lb-f/in. Additionally, let the relaxed spring length be $h_0=2$ inches. Further, let the compressed length $h_1=1.5$ inches, with the electrode at maximum extension of 0.5 inches, as shown in FIG. 26A. The force is Fr=70(2−1.5)=35 lb-f. In FIG. 26B, the PCD electrode 54 is fully retracted within the drill collar 112, and the compressed length $h_2=1$ inch. The force becomes Fr=70(2−1)=70 lb-f. Thus, the range of the force on the PCD electrode 54 is between 35 and 70 lb-f. Further, increasing the uncompressed length $h_0$ may reduce the range of the force applied to the PCD electrode 54.

Figure 27:
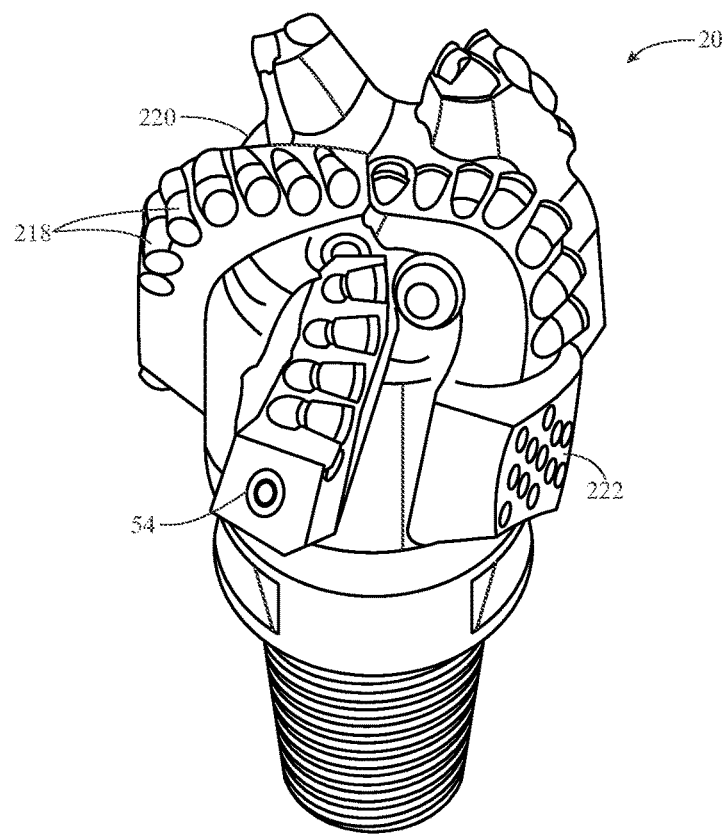
FIG. 27 is a perspective view of a drill bit including a PCD electrode on a gauge pad, in accordance with an embodiment.

In another embodiment, FIG. 27 depicts a perspective view of the drill bit 20 including the PCD electrode 54. The drill bit 20 may include PDC cutters 218 mounted on a crown 220 and gauge pads 222 mounted around a circumference of the drill bit 20 and located above the PDC cutters 218. The gauge pads 222 may not cut the formation, but, rather, the gauge pads 222 may stabilize the drill bit 20 during drilling operations and minimize chatter in a transverse direction. Accordingly, a diameter of the gauge pads 222 may be very close to a diameter of the wellbore 26 created by the PDC cutters 218. Further, as the gauge pads 222 constantly rub against the geological formation 12 and absorb the transverse forces, the gauge pads 222 may be under constant abrasive stress. Therefore, the gauge pads 222 may generally use thermally stable polycrystalline diamond (TPS) inserts to reduce wear on tungsten carbide gauges.

In the illustrated embodiment, the PCD electrode 54 may be integrated into the gauge pad 222 on the drill bit 20. An advantage of mounting the PCD electrode 54 on the gauge pad 222 is that the gauge pad 222 is in constant contact with the wall of the wellbore 26. Accordingly, a hydraulic mechanism or spring for activation is not used. Thus, the PCD electrode 54 may provide valid measurements in the insulating OBM and the conductive WBM. Further, a resistivity measure point is located at the drill bit 20, where it can provide a first indication of properties of the geological formation 12. For example, such properties may include a change in formation, or an indication of entering an abnormal high pressure or low pressure formation. If the formation pressure is abnormally low, spurt loss may occur and a rapid change in resistivity may be detected. Further, the PCD electrode 54 mounted on the gauge pad 222 may produce an image of the wellbore 26. This may be useful in geosteering a horizontal well, for example, when the drill bit 20 exits a resistive pay zone and enters a conductive shale.

Figure 28:
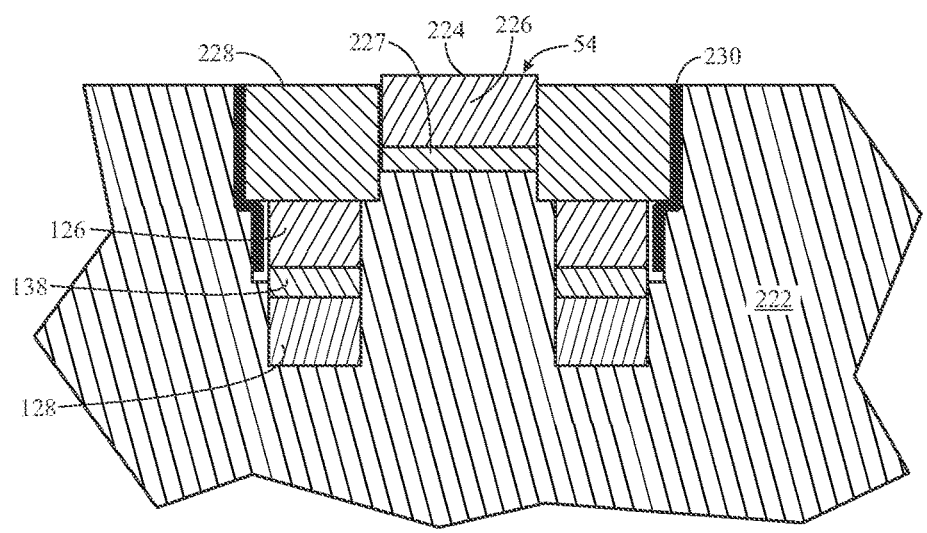
FIG. 28 is a cross-sectional view of the gauge pad of FIG. 27 including the PCD electrode of FIG. 27, in accordance with an embodiment.
Figure 29:
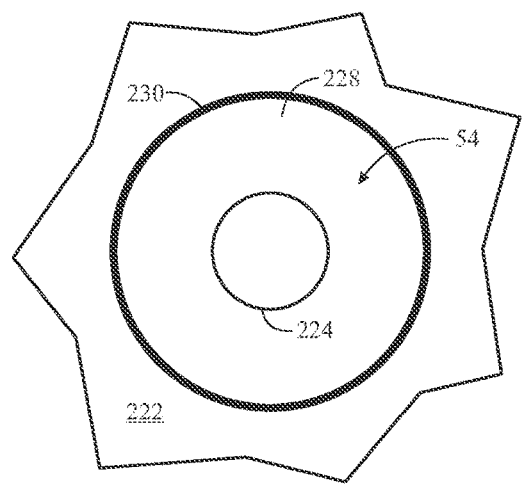
FIG. 29 is a top view of the gauge pad of FIG. 28 with the PCD electrode, in accordance with an embodiment.

With the foregoing in mind, FIG. 28 depicts a cross-sectional view of the gauge pad 222 including the PCD electrode 54. A PCD disk 224 may be brazed to a post 226 surrounded by circular grooves machined into the gauge pad 222 and including a tungsten carbide substrate 227. The post 226 may also be a treaded rod welded into a steel body of the drill bit 20. Further, the post 226 may be strong enough to support the PCD electrode 54 during drilling operations. The machined grooves receive the source transmitting toroidal transformer 126, the shield 138, and the measure toroidal transformer 128. There may be electrical connections (wires and pressure bulkheads) from the toroidal transformers 126 and 128 that couple to electronics mounted in the drill bit 20 (not shown). Additionally, an insulating ring 228 may be made of an insulating PCD material. For example, PCD sintered with calcium carbonate. In some embodiments, a ceramic ring may also be used. Further, a metal ring 230 may be brazed to the insulating ring 228, and the metal ring 230 may extend below the insulating ring 228. The metal ring 230 may be force fit into the circular groove to lock the two toroidal transformers 126 and 128 and the shield 138 in place. Furthermore, a high temperature epoxy may be injected into the circular grooves to seal any voids where fluids might otherwise enter. In addition, FIG. 29 depicts a top view of the gauge pad 222 with the PCD electrode 54, as described above in relation to FIG. 28.

Figure 30:
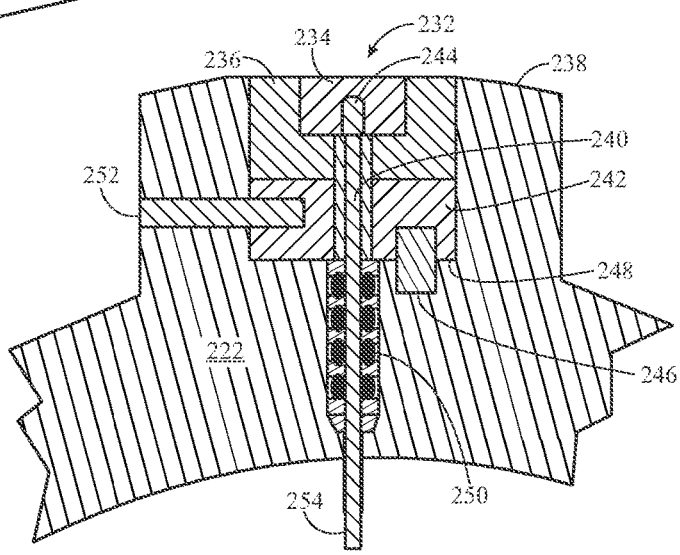
FIG. 30 is a cross-sectional view of a wired PCD sensor installed in the gauge pad of the drill bit of FIG. 27, in accordance with an embodiment.

In another embodiment, FIG. 30 depicts a cross-sectional view of a wired PCD sensor 232 installed in the gauge pad 222 of the drill bit 20. The wired PCD sensor 232 may not use toroids, but, instead, the wired PCD sensor 232 may be directly wired to measurement electronics. The wired PCD sensor 232 may include a button electrode 234 in an insulating ring 236. The button electrode 234 may be flush with a top surface 238 of the gauge pad 222, and diameters of the gauge pads 222 are substantially similar to the diameter of the wellbore 26. Accordingly, the button electrode 234 is likely to be in constant direct contact with the wall of the wellbore 26. Since the button electrode 234 is in the gauge pad 222, it may rub against the geological formation 12, but the button electrode 234 may not cut into the geological formation 12. Further, the drill bit 20 may have one or more of the wired PCD sensors 232, and the drill bit 20 may also contain the measurement electronics to which the wired PCD sensors 232 are coupled. A power supply, a data processor, and a telemetry device may also be present in or near the drill bit 20.

The wired PCD sensor 232 may be designed to occupy a small volume of the drill bit 20. The button electrode 234 may consist of a tungsten carbide (WC) disk that is approximately 0.4 inches in diameter and 0.2 inches thick. There may be a shallow hole in a bottom portion of the button electrode approximately 0.1 inches in diameter. Additionally, the insulating ring 236 may be made from PCD material with calcium carbonate solvent-catalyst. The insulating ring may be approximately 0.8 inches in diameter by 0.4 inches thick. Further, the insulating ring may have a 0.4 inch diameter recess to receive the button electrode 234 and a 0.13 inch diameter hole to receive a wire 240. A tungsten carbide substrate 242 may be positioned below the insulating ring 236 and be approximately 0.8 inches in diameter and 0.3 inches thick. It may also have a 0.13 inch hole similar to the hole in the insulating ring 236 to receive the wire 240. The wire 240 may have a steel core with copper coating and with polyether ether ketone (PEEK) insulation. There may be a 0.1 inch diameter metal head 244 coupled to the wire 240 and positioned within the button electrode 234 (e.g. by welding). The dimensions listed above are illustrative to give an example of sizes that the wired PCD sensor 232 may occupy; however, other dimensions are also conceived.

Additionally, an anti-rotation pin 246 may be included in the configuration of the wired PCD sensor 232. The anti-rotation pin 246 may minimize rotation of the wired PCD sensor 232, which may preserve longevity of the wire 240. Further, the anti-rotation pin 246 may function to hold the wired PCD sensor 232 in position within the gauge pad 222. The anti-rotation pin 246 may be positioned on a bottom surface 248 of the tungsten carbide substrate 242.

Further, an o-ring stack 250 may be added to the wire 240. The wire 240 may resist forces resulting from a pressure drop across the o-ring stack 250 and the wire 240. The wired PCD sensor 232 may be inserted into a pocket in the gauge pad 222 of the drill bit 20. The wired PCD sensor 232 may be locked into place by a transverse bolt 252. Further, inside the drill bit 20, a bare end 254 of the wire 240 may be inserted into a socket (not shown) which may be attached to the sensor electronics. The socket and electronics may be at atmospheric pressure and located within a pressure housing.

Figure 31:
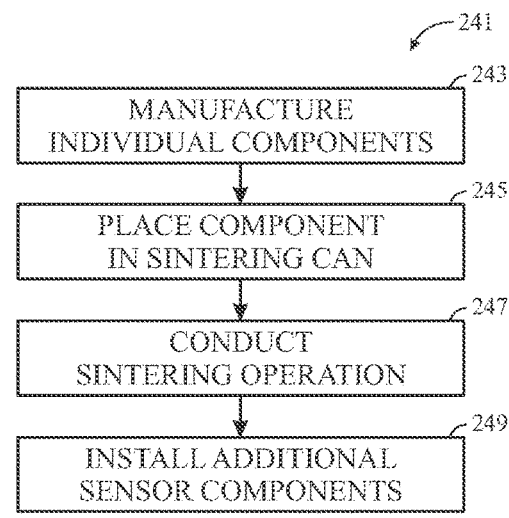
FIG. 31 is a flowchart of a method to bond individual components of the wired PCD sensor of FIG. 30 into a single rigid composite material, in accordance with an embodiment.

To fabricate the conductive and non-conductive portions of the wired PCD sensor 232, such as the button electrode 234 and the insulating ring 236, respectively, FIG. 31 is a flowchart of a method 241 to bond individual components of the wired PCD sensor 232 into a single rigid composite material. Initially, individual components of the wired PCD sensor 232 may be manufactured (block 243). For example, the button electrode 234, the insulating ring 236, and the tungsten carbide substrate 242 may be manufactured separately. Further, the button electrode 234 may include a conductive solvent-catalyst, such as cobalt, so that the button electrode 234 is a conductive PCD material. Additionally, the insulating ring 236 may be manufactured with calcium carbonate (CaCO3) to generate an insulative PCD material, or the insulating ring 236 may be manufactured with cobalt with the surface leached and backfilled with conductive material to produce an insulative PCD material.

Subsequently, the individual components of the wired PCD sensor 232 may be placed in a sintering can (block 245). Placing the components in the sintering may align the individual components of the wired PCD sensor 232 in an appropriate position prior to conducting an additional sintering process. After the alignment within the sintering can, a sintering operation may be conducted (block 247). The sintering operation may fuse the previously manufactured individual components together to generate a single rigid composite material. Further, the sintering operation may involve applying sufficient pressure and heat to melt the cobalt and fuse the components together.

After the sintering operation, additional components of the wired PCD sensor 232 may be added to the wired PCD sensor 232 (block 249). This step may prepare the wired PCD sensor 232 for installation within the drill bit 20. The additional components may include the wire 240, the metal head 244, and the o-ring stack 250. Upon installation in the drill bit 20, the anti-rotation pin 246 and the transverse bolt 252 may also be added to the wired PCD sensor 232, as discussed above in the discussion of FIG. 30.

Figure 32A:
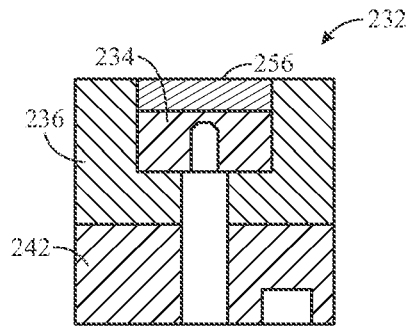
FIG. 32A is a cross-sectional view of the wired PCD sensor of FIG. 30 where a button electrode is faced with a conducting PCD material, in accordance with an embodiment.
Figure 32B:
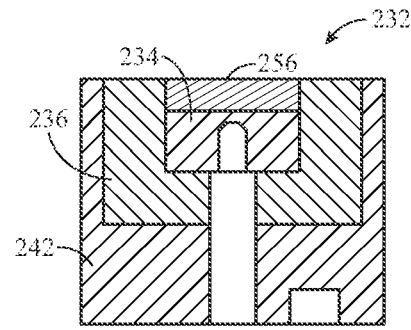
FIG. 32B is a cross-sectional view of the wired PCD sensor of FIG. 32A with an insulating ring encircled by a tungsten carbide substrate, in accordance with an embodiment.

There may be several design variations of the wired PCD sensor 232. For example, FIG. 32A is a cross-sectional view of the wired PCD sensor 232 where the button electrode 234 may be faced with a conducting PCD material 256 to provide more robustness to the button electrode 234. In another design variation, FIG. 32B is a cross-sectional view of the wired PCD sensor 232 of FIG. 32A with the insulating ring 236 encircled by the tungsten carbide substrate 242. The tungsten carbide substrate 242 encircling the insulating ring 236 may place the insulating ring 236 in compression. For example, if the insulating ring 236 is made from a ceramic material, initial compression of the ceramic material may increase impact resistance of the insulating ring 236. Similarly, if the insulating ring 236 is made from an insulating PCD material, the initial compression by the tungsten carbide substrate 242 may also enhance impact resistance characteristics of the insulating ring 236. The PCD sensors 232 described above in FIGS. 30-32 may be used in single sensor embodiments for radio-frequency impedance measurements. From the radio-frequency impedance measurements, the formation resistivity may be obtained. Additionally, the current return for the wired PCD sensors 232 may be through the gauge pad 222 of the drill bit 20.

Figure 33A:
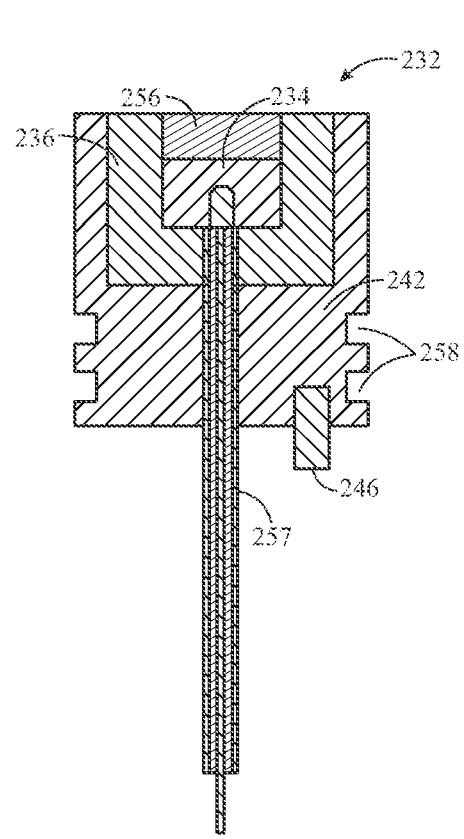
FIG. 33A is a cross-sectional view of the wired PCD sensor of FIG. 30 with a coaxial cable, in accordance with an embodiment.

Additionally, FIG. 33A depicts a high pressure coaxial cable 257 brazed to the tungsten carbide substrate 242 of the wired PCD sensor 232 to replace a pressure seal provided by the o-ring stack 250 depicted in FIG. 30. The high pressure coaxial cable 257 may be rated to 1000 degrees C. and 10,000 psi. Accordingly, the high pressure coaxial cable 257 may be brazed to the tungsten carbide substrate 242 to provide a pressure seal between the coaxial cable 257 and the WC substrate 252. Additionally, the tungsten carbide substrate 242 may have conventional o-ring grooves 258 to pressure seal the wired PCD sensor 232 to the gauge pad 222 of the drill bit 20. Additionally, similar to the wired PCD electrode 232 depicted in FIG. 30, a diameter of the button electrode 234 may be 0.4 inches. Further, a diameter of the insulating ring 236 may be 0.8 inches. Furthermore, a diameter of the tungsten carbide substrate 242 may be approximately 1 inch.

Figure 33B:
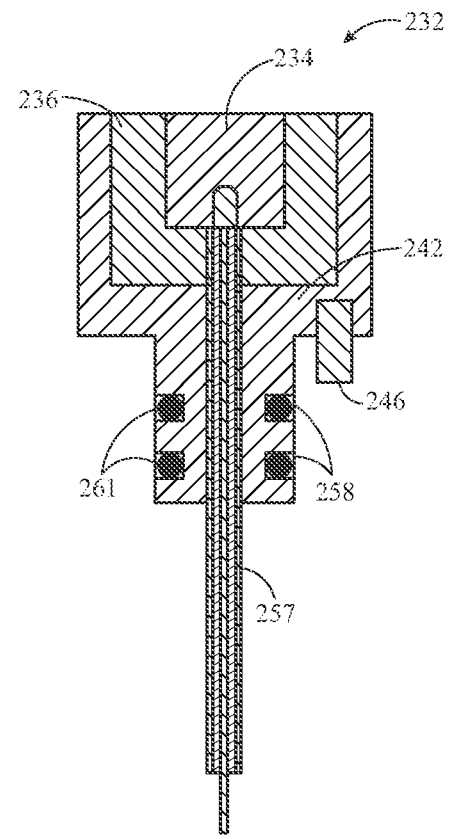
FIG. 33B is a cross-sectional view of a wired PCD sensor with a coaxial cable, in accordance with an embodiment.

Further, FIG. 33B depicts the high pressure coaxial cable 257 brazed to the tungsten carbide substrate 242 of the wired PCD sensor 232 where a diameter of a portion of the wired PCD sensor 242 including the o-ring grooves 258 and o-rings 261 is reduced. The o-ring grooves 258 and the o-rings 261 may enable pressure sealing of the wired PCD sensor 232 to the gauge pad 222 of the drill bit 20.

Figure 34:
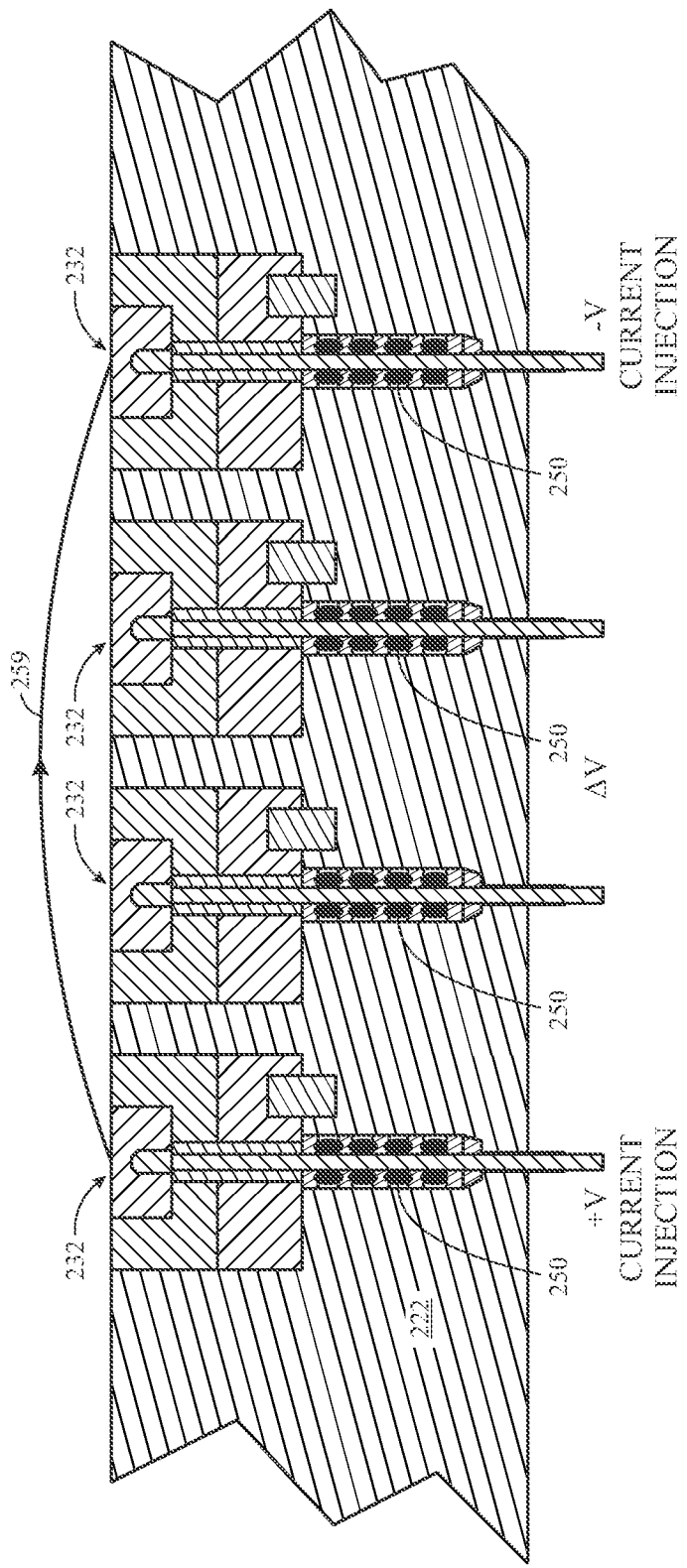
FIG. 34 is a cross-sectional view of the gauge pad of FIG. 27 with more than one of the wired PCD sensors of FIG. 30 for a sophisticated formation measurement scheme, in accordance with an embodiment.

FIG. 34 is a cross-sectional view of an embodiment using more than one of the wired PCD sensors 232 for a sophisticated formation measurement scheme. The illustrated embodiment includes four of the wired PCD sensors 232 mounted in the gauge pad 222 of the drill bit 20. The two outer wired PCD sensors 232 may inject alternating current into the geological formation 12. Injecting the alternating current may establish a voltage (or potential) field 259 in the geological formation 12. The two inner wired PCD sensors 232 may monitor a voltage drop (ΔV) in the geological formation 12 between the two inner wired PCD sensors 232 by being communicatively coupled to an operational amplifier with a very high impedance (not shown). The two inner wired PCD sensors 232 may draw very little current. Accordingly, little to no voltage drop across the interface between the two inner wired PCD sensors 232 and the effect of the geological formation 12 on the voltage drop may be observed.

Figure 35:
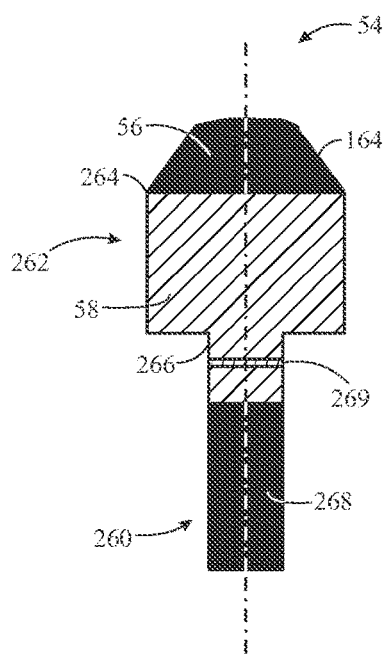
FIG. 35 is a cross-sectional view of the PCD electrode of FIG. 2 brazed to an electrode tail, in accordance with an embodiment.

Turning now to forming different variations of the PCD electrode 54, FIG. 35 is a cross-sectional view of the PCD electrode 54 brazed to an electrode tail 260. An upper body 262 of the PCD electrode 54 may be sintered as a cylinder with on a long section of the tungsten carbide base 58. The solvent-catalyst of the sintering process may be cobalt. After the sintering process, the electrode face may include a thick layer of the PCD 56. A shape of the thick layer of the PCD 56 may be obtained directly from the sintering process using a metal sintering can with a geometry corresponding to the desired shape. Further, the PCD electrode 54 may be sintered with cobalt to provide wear resistance and impact resistance. The cobalt may generally be between 5% and 10% by volume, although higher amounts of the cobalt may be used when increased conductivity is desired. Further, an interface 264 between the PCD 56 and tungsten carbide base 58 may be nearly spherical to minimize stress in the PCD 56 and to avoid cracks during a cooling phase of the sintering process. Further, the nearly spherical interface 264 may enable good load transmission from the PCD 56 to the tungsten carbide base 58.

After the sintering process, the upper body portion 262 may be an approximate cylinder of a 1.5 inch diameter by 1.2 inch length. The upper body portion 262 may be machined to a final shape, for example via Electrical Discharge Machining (EDM). A spherical top surface of the PCD 56 may be corrected (or obtained) by plunge EDM with a specifically shaped electrode. Additionally, controlled grinding may also be used for shaping the PCD 56. The chamfered surface 164 may be obtained with wire-EDM involving rotation of the electrode during the EDM process. Further, a short tail 266 may be obtained by an EDM process or by grinding.

The electrode tail 260 may be sintered as a separate part. An overall diameter of the electrode tail 260 may be in the range of 0.4 inches, while a total length of the electrode tail may be approximately 1 inch. A length of a PCD portion 268 of the electrode tail 260 may be up to 0.8 inches. Benefits of the long PCD portion 268 in the electrode tail 260 include abrasion resistance when the PCD portion 268 is the lower mobile guidance surface 186 and low friction between the PCD portion 268 and the lower static guidance surface 188.

After machining, the electrode tail 260 and the upper body 262 may be brazed together at a seam 269. The short tail 266 of the upper body 262 may be attached to the PCD portion 268 using an induction brazing process while limiting heat propagation into the PCD portions 56 and 268. This containment of the heat outside the PCD portions 56 and 58 may help avoid crack generation in the PCD portions 56 and 58 due to the high temperature sintering process.

Figure 36:
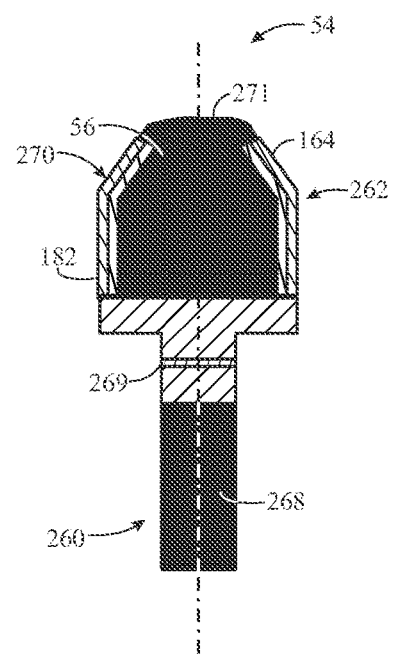
FIG. 36 is a cross-sectional view of the PCD electrode of FIG. 2 with integral insulation, in accordance with an embodiment.

In another configuration, FIG. 36 is a cross-sectional view of the PCD electrode 54 with integral insulation. The upper body 262 of the PCD electrode 54 may contain a larger volume of the PCD 56 with both leached surfaces 270 and unleached surfaces 271. The unleached surfaces 271 may be electrically conductive, while the leached surfaces 270 may be insulating. After leaching, the leached surfaces 270 may be filled with an insulating material, such as epoxy. In the illustrated embodiment, the chamfered surface 164 and upper mobile guidance surfaces 182 may be leached and insulating.

Figure 37:
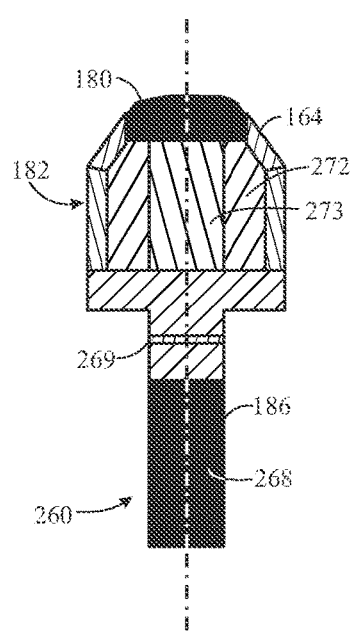
FIG. 37 is a cross-sectional view of the PCD electrode of FIG. 2 with several regions made from different PCD materials, in accordance with an embodiment.

Composites of different PDC materials may also be used to form the PCD electrode 54. For example, FIG. 37 is a cross-sectional view of the PCD electrode 54 with several regions made from different PCD materials. The composites may provide different properties for each region of the PCD electrode 54. For example, the illustrated PCD electrode 54 is divided into five regions. The face 180 may be made from an electrically conductive PCD 56 to be electrically conductive, wear resistant, and impact resistant. This face 180 may be unleached PCD with cobalt as the solvent-catalyst and consisting of a wide range of diamond grains spanning sizes of 1 to 40 microns.

A circumference of the PCD electrode 54 may be around the upper mobile guidance surface 182. This portion of the PCD electrode 54 may be electrically insulating and wear resistant. Accordingly, the upper mobile guidance surface 182 may be made from leached PCD material or made with an insulating solvent-catalyst (e.g., calcium carbonate). Additionally, small diamond grains may be used in the sintering process to provide an appropriate level of wear resistance.

Additionally, the chamfered surface 164 of the PCD electrode 54 may be wear resistant, impact resistant, and electrically insulating. Accordingly, a PCD material can be a compromise between the PCD materials of the face 180 and the upper mobile guidance surface 182. That is, the PCD material of the chamfered surface 164 may be made with a conductive solvent-catalyst, but the chamfered surface 164 may also be leached and refilled with an insulating material.

Further, an annular region 272 may provide mechanical strength and some fatigue resistance for the PCD electrode 54 to withstand repetitive loads in any direction. In particular, when the PCD electrode 54 extends into the wellbore 26 and transverse loads occur on the face 180 or the chamfered surface 164, transverse forces may be applied to the upper and lower mobile guidance surfaces 182 and 186. Accordingly, the PCD electrode 54 may be strong enough to resist bending. This strength may be handled by the annular region 272, which may be made from unleached PCD including a cobalt solvent-catalyst and a range of small to medium sized diamond grains (1 to 10 microns). The cobalt solvent-catalyst may be approximately 10% by volume to provide mechanical strength (e.g., tensile strength to resist bending and provide ability to withstand fatigue loading). Further, a PCD central region 273 may provide electrical conductivity in a frequency range of operation of the PCD electrode 54.

Figure 38:
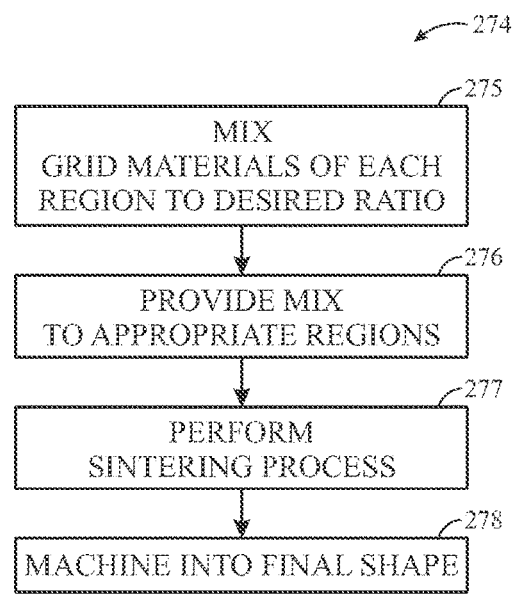
FIG. 38 is a flowchart of a method to construct the PCD electrode of FIG. 37, in accordance with an embodiment.

In constructing the composite PCD electrode 54 depicted in FIG. 37, several methods may be used. For example, FIG. 38 is a flowchart of a method 274 for constructing the composite PCD electrode 54 depicted in FIG. 37. Initially, each region of the PCD electrode 54 may be prepared by mixing a desired ratio of diamond grains and solvent-catalyst prior to the sintering process (block 275). Mixes may be held in an appropriate region shape or deposited in an appropriate region location with the aid of a wax or thermoplastic substance included as a portion of the mixes.

After the mixes are prepared, the mixes may be provided to areas corresponding to regions of the composite PCD electrode 54 prior to the sintering process (block 276). For example, the mixes may be formed into the region shapes using molds, and the molded shapes may be installed in the sintering can in the areas corresponding to regions of the composite PCD electrode 54. Additionally, the mixes may be formed into the regions shapes within the sintering can using various syringes containing the mixes while the mixes are molten. The syringes may deposit the mixes in their respective positions within the sintering can.

Subsequently, the sintering process described above relating to FIG. 3 may produce the composite PCD electrode 54 (block 277). Further, upon completion of the sintering process, the composite PCD electrode 54 may be machined into a final shape (block 278). It may be appreciated that while the method 274 described above includes a single sintering process, multiple sintering process may also produce the composite PCD electrode 54. For example, each of the regions may be placed in separate sintering cans and sintered individually. Some of the sintered regions may be machined to resolve any imperfections in shape, and then the sintered regions may be loaded into a final sintering can. At this time, the sintered regions may experience a final sintering cycle. Further, any combination of the processes described above is also conceived. For example, several regions may individually go through the sintering process, and the several sintered regions may join with the shaped molds of pre-sintered mixes in a final sintering can for a final sintering process to produce the composite PCD electrode 54.

FIG. 39 is a cross-sectional view of a sintering device 279 used to fabricate an insulating ring that may be used as the upper mobile guidance surface 182 depicted in FIG. 37. A process, described in detail below, may be used to fabricate insulating PCD components which contain a hole. The sintering process is performed using two metal cans, a main can 280 and an internal can 281 disposed within the main can 280. Both of the cans 280 and 281 may be cylindrical. Further, the internal can 281 may correspond to a size of a central bore of the upper mobile guidance surface 182, which is a section that may be removed from the insulating ring upon completion of the fabrication process. The inner can 281 may be full of an insulating mix 282 (e.g. diamond grains and calcium carbonate) for sintering. The main can 280 may contain the insulating mix 282 for the insulating PCD material of the insulating ring. The cans 280 and 281 may contain the same mix 282 so that the insulating mix 282 is reduced in size by a similar amount during the sintering process. After completing the sintering process, the cans 280 and 281 may be dissolved in acid. When the internal can 281 dissolves, an inner cylinder of insulating PCD material corresponding to the central bore of the insulating ring may be removed. This leaves an outer ring of insulating PCD, which may be ground to a final shape corresponding to the upper mobile guidance surface 182, for example. Additionally, the internal can 281 may have a more complex shape (e.g., a conical shape) to produce a bore with a complex shape within the insulating ring.

Additionally, FIG. 40 is a flowchart of a method 283 for forming the insulating ring, as discussed in FIG. 39. Initially, the internal can 281 may be placed within the main can 280 (block 284). The internal can 281 and the main can 280 may both be made from a similar material. For example, both the internal can 281 and the main can 280 may be made from a metal that readily dissolves in certain acids. Further, the material that makes up the internal can 281 and the main can 280 may be a material capable of withstanding heat and pressure applied during the sintering process.

Subsequently, the main can 280 and the internal can 281 are filled with the insulating mix 282 (block 285). The insulating mix 282 may be the same in both the main can 280 and the internal can 281. As discussed above in relation to FIG. 38, the insulating mixes 282 in the main can 280 and the internal can 281 may be reduced in size proportionally during the sintering process when the insulating mixes 282 are the same or similar in composition. It may also be appreciated that cobalt, or another conductive solvent-catalyst, may be used in place of the insulating mixes 282. In such a situation, a surface of the resulting PCD material may be leached to generate insulating properties in the resulting PCD material.

Next, the sintering process may be performed on the cans 280 and 281 (block 286). The sintering process may be similar to the method 60 discussed above in the discussion of FIG. 3. During the sintering process, the carbon bonds of the insulating ring may be formed to create an insulating PCD material.

Once the sintering process of block 286 is completed, the cans 280 and 281 may be dissolved (block 287). In dissolving the cans 280 and 281, material within the central bore of the insulating ring may be removed. Accordingly, the insulating ring made from the insulating PCD material may remain. To provide an adequate fit with other components of the PCD electrode 54 or the drill collar 112, the insulating ring may be ground into a final shape upon dissolving the cans 280 and 281 (block 288). In this manner, any imperfections resulting from the sintering process may be removed.

Turning now to operation of the PCD electrodes 54, FIG. 41 is a method 290 to determine a formation resistivity of the geological formation with the PCD electrodes 54. Initially, alternating current may be injected into the geological formation 12 via at least one of the PCD electrodes 54 (block 292). The transmitting toroidal transformer 126 may generate a voltage drop across the PCD electrode 54. The voltage drop across the PCD electrode 54 may generate a current that is injected into the geological formation 12 due to the contact of the PCD electrode 54 with the geological formation 12. Additionally, in an OBM environment, a frequency of the alternating current may be in a range of approximately 100 kHz to 100 MHz. Further, in a WBM environment, the frequency of the alternating current may be in a range of approximately 1 kHz to 100 MHz.

Subsequently, the measure toroidal transformer 128 may measure the current that was injected into the geological formation 12 (block 294). The current may enter the geological formation 12 at the PCD electrode 54 and return to the drill collar 112 by way of another contact point between the drill collar 112 and the geological formation 12. Further, upon returning to the drill collar 112, the current may travel back toward the PCD electrode 54, which may include the measure toroidal transformer 128 for measuring the return current. The measure toroidal transformer 128 may also be positioned around another PCD electrode 54 mounted on a portion of the drill collar 112, the stabilizers 114, the upset 116, or the drill bit 20. Additionally, the measure toroidal transformer 128 may also directly measure the current injected into the geological formation 12.

Next, the measured current may be analyzed to determine a formation resistance of the geological formation 12 (block 296). With the value of the voltage drop across the PCD electrode 54 known and a value of the return current known, a complex impedance of the PCD electrode 54 in contact with the geological formation 12 may be calculated. From the complex impedance, the formation resistivity may be determined. The complex impedance may include effects due to OBM. Such determinations may be accomplished by the data processing system 44 discussed above.

After determining the formation resistance, a formation resistivity may be calculated from the value of the formation resistance (block 298). A geometrical factor may relate the formation resistance to the formation resistivity. Additionally, the geometrical factor may be a known constant. Further, the formation resistivity calculation may also be accomplished by the data processing system 44.

The formation resistivity generated from the method 290 may be beneficial for determining characteristics of the geological formation 12. For example, the formation resistivity may indicate characteristics of a mineral composition of the geological formation 12. Further, using the techniques described in the present specification, the formation resistivity may be determined in the presence of insulating OBM during a drilling operation while resisting wear by the PCD electrode 54.

Figure 42:
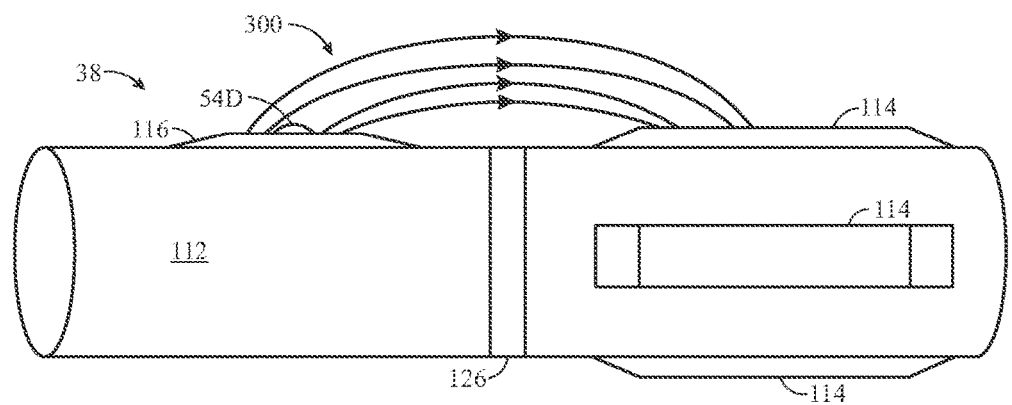
FIG. 42 is a side view of a LWD tool with a passive focusing scheme, in accordance with an embodiment.

Variations to the LWD tools 38 based on concepts described above may also be available. For example, FIG. 42 depicts a side view of the LWD tool 38 with a passive focusing scheme. The transmitting toroidal transformer 126 may mounted around the drill collar rather than around the PCD electrode 54. The transmitting toroidal transformer 126 may generate a voltage drop across the drill collar 112 which may stimulate a current 300 to flow into the geological formation 12. There may be at least one PCD electrode 54D with a measure toroidal transformer 128 mounted around the PCD electrode 54D. Additionally, the PCD electrode 54D may be similar to the PCD electrode 54D depicted in FIG. 13. Additionally, a current return location may simply consist of the blades of the stabilizer 114 as at least one of the blades of the stabilizer 114 may be in contact with the geological formation 12 substantially continuously.

The upset 116 may be at the same voltage as the PCD electrode 54D and may function as a guard electrode. This configuration may focus the current 300 from the PCD electrode 54D deeper into the formation than when the current return location (e.g., the stabilizer 114) is close to the PCD electrode 54D. In the illustrated embodiment, the current returns to the other side of the transmitting toroidal transformer 126 due to the generated voltage drop across the drill collar 112. Further, moving parts of this configuration are limited to the PCD electrode 54D.

Figure 43:
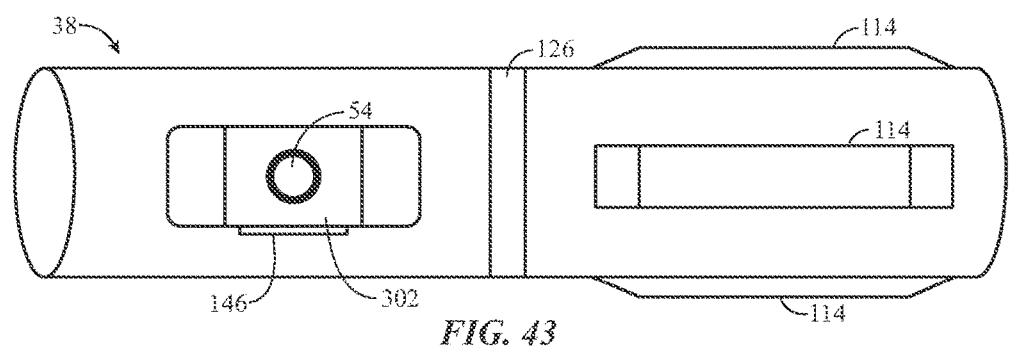
FIG. 43 is a side view of a variation of the LWD tool of FIG. 42 with a hinged pad, in accordance with an embodiment.

FIG. 43 depicts a side view of a variation of the configuration of FIG. 42 with a hinged pad 302 in place of the fixed upset 116. A pressure activated piston may push the hinged pad 302 against the wall of the wellbore 26. Operation of the hinged pad 302 may be substantially similar to the operation of the return electrode 144 described above in relation to FIGS. 14A and 14B. Additionally, the hinged pad 302 may surround two or more of the PCD electrodes 54D. The multiple PCD electrodes 54D may be time multiplexed or operate at different frequencies to minimize occurrences of cross-talk.

Figure 44:
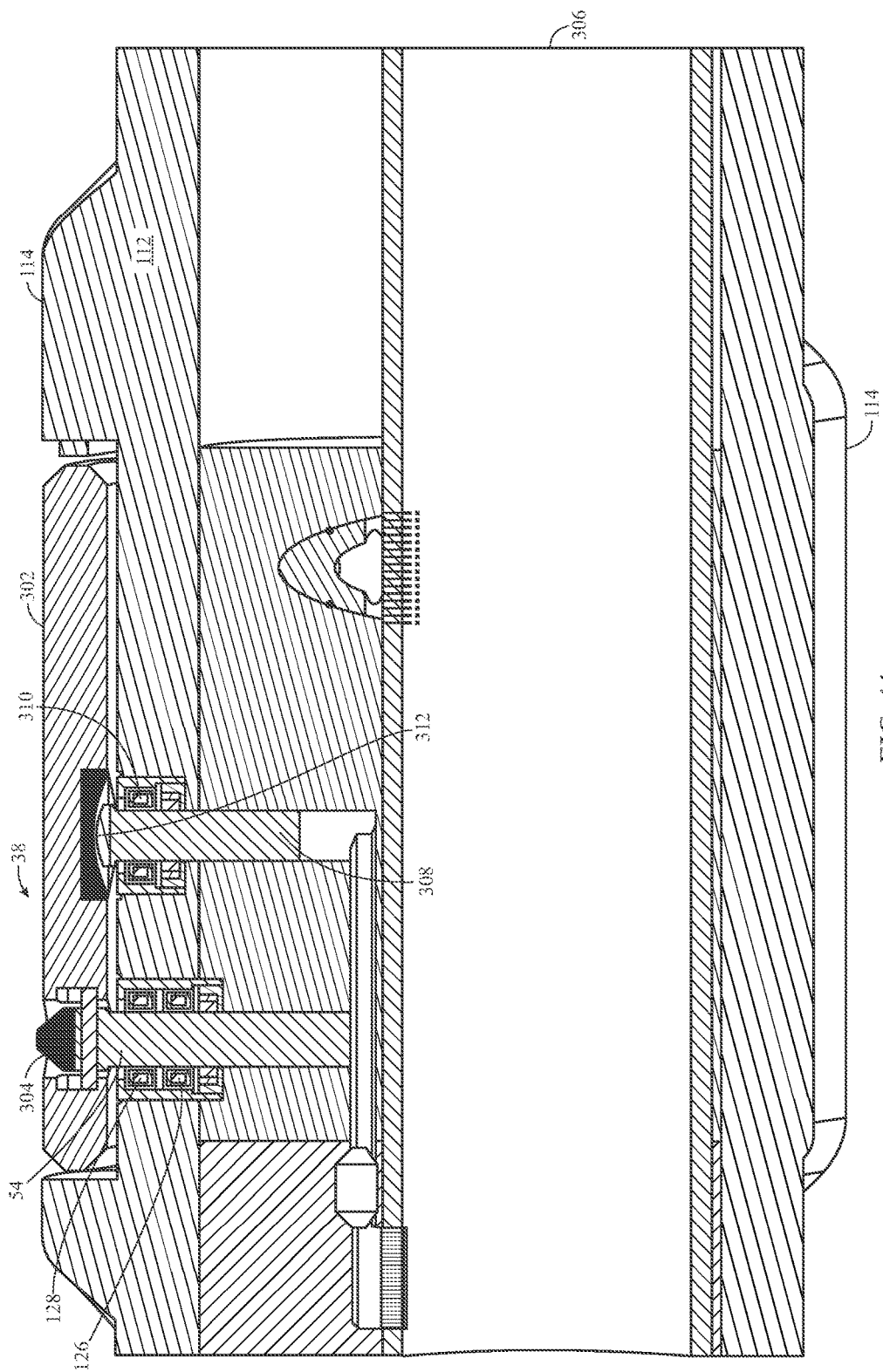
FIG. 44 is a cross-sectional view of an LWD tool with an imaging system with a focusing feature, in accordance with an embodiment.

In another variation of the LWD tool 38, FIG. 44 is a cross-sectional view of the LWD tool 38 with an imaging system with a focusing feature. The drill collar 112 may have a three-blade stabilizer 114. Two stabilizer blades may be fixed, while a third stabilizer blade may include the hinged pad 302 and the PCD electrode 54. The PCD electrode 54 may pass through a window 304 in the hinged pad 302. The drill collar 112 includes an internal bore 306 to allow flow of the drilling fluid 23. The internal bore 306 may be eccentric to enable a long stroke for the PCD electrode 54.

The PCD electrode 54 may have a transmitting toroidal transformer 126 and a measure toroidal transformer 128. The PCD electrode 54 may generate an image of the wellbore 26 as the LWD tool 38 rotates. Further, a pressure drop across a wall of the drill collar 112 may provide a force to press the PCD electrode 54 against a wall of the wellbore 26.

Additionally, the hinged pad 302 may operate as a focusing electrode by maintaining a same voltage as the PCD electrode 54. Maintaining the same voltage may force current from the PCD electrode 54 deeper into the geological formation 12. The hinged pad 302 may be driven by a pad mobile electrode 308, which may provide mechanical force and voltage to the hinged pad 302. Further, the pad mobile electrode 308 may also have a drive toroid 310. The drive toroid 310 may enable the hinged pad 302 to maintain the same voltage level as the PCD electrode 54. The transmitting toroidal transformer 126 and the drive toroid 310 may have the same number of turns, but the drive toroid 310 may have a larger magnetic core and may use larger gauge wire to supply higher levels of current to compensate for a larger size of the hinged pad 302 than the PCD electrode 54. The pad mobile electrode 308 may push against a contact pad 312 made of conductive, wear resistant material such as unleached PCD.

Figure 45:
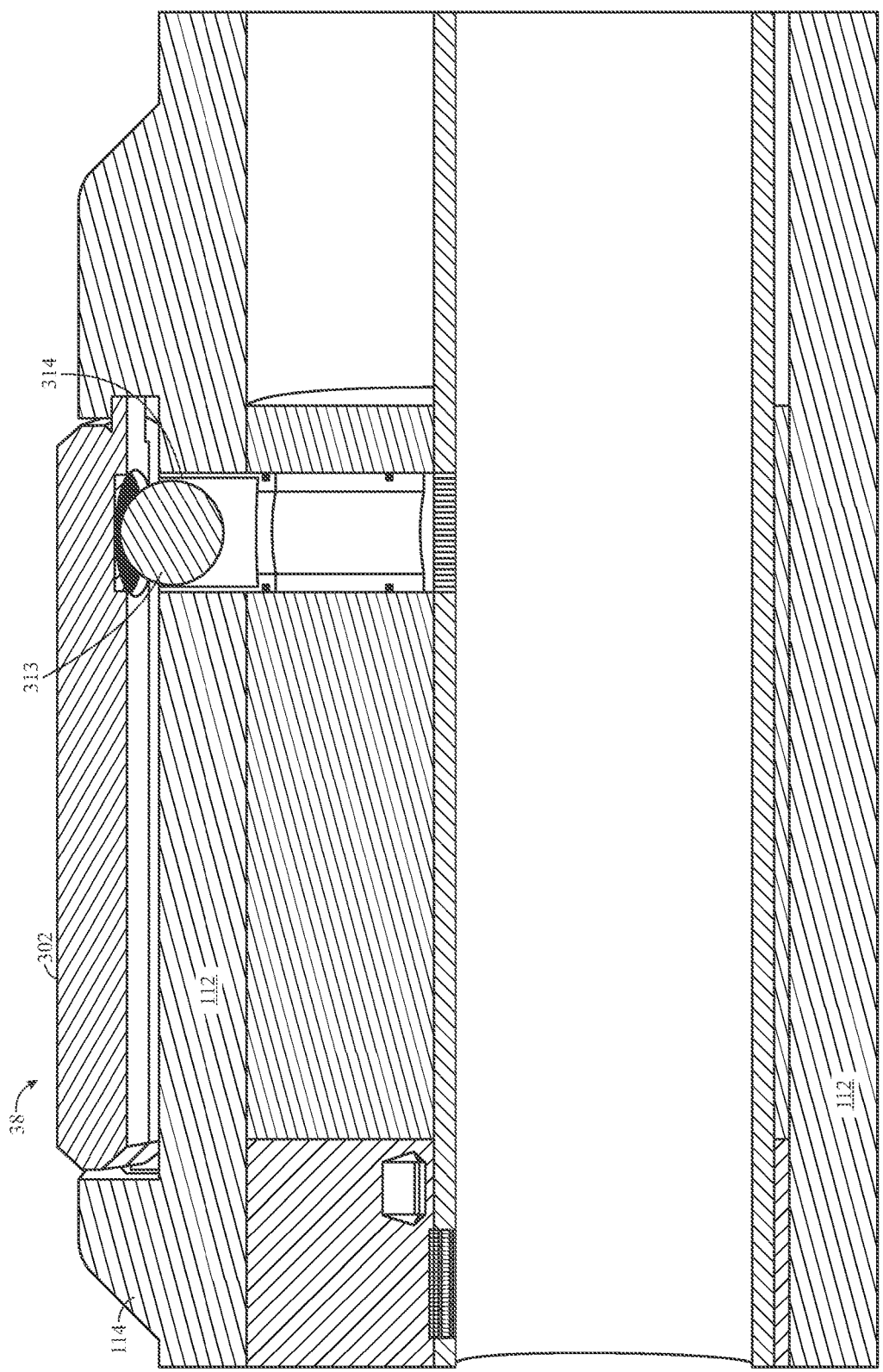
FIG. 45 is a cross-sectional view of the LWD tool of FIG. 44 with a push-ball to provide efficient application of force to a hinged pad, in accordance with an embodiment.

Referring to now to FIG. 45, a push-ball 313 may be used in the configuration of FIG. 44 to provide efficient application of force to the hinged pad 302. The pressure drop across the wall of the drill collar 112 may be applied to the push ball. The push-ball 313 and/or a bore 314 holding the push-ball 313 may be insulating so that the push-ball 313 and/or the bore 314 do not short the hinged pad 302 to the drill collar 112. Accordingly, the push-ball 313 and the bore 314 may be made of leached PCD or intrinsically insulating PCD.

Further, FIG. 46 is a cross-sectional view of the hinged pad 302 and the hinge 146 coupled to the hinged pad 302. The hinge 146 may be insulating to avoid shorting the hinged pad 302 to the drill collar 112. Accordingly, the hinge 146 may be coupled to the drill collar 112 with insulating inserts 316 at both ends of the hinge 146. The inserts 316 may have a spherical cavity at one end and an oval slot at the other. Such a configuration may allow an axis of the hinge 146 to deviate from being parallel to an axis of the LWD tool 38, which may enable increased contact between the hinged pad 302 and the wall of the wellbore 26. Even when the wellbore 26 is not cylindrical, or when the LWD tool 38 is not parallel to an axis of the wellbore 26, an additional degree of freedom may enable the hinged pad 302 to contact the geological formation.

Figure 47A:
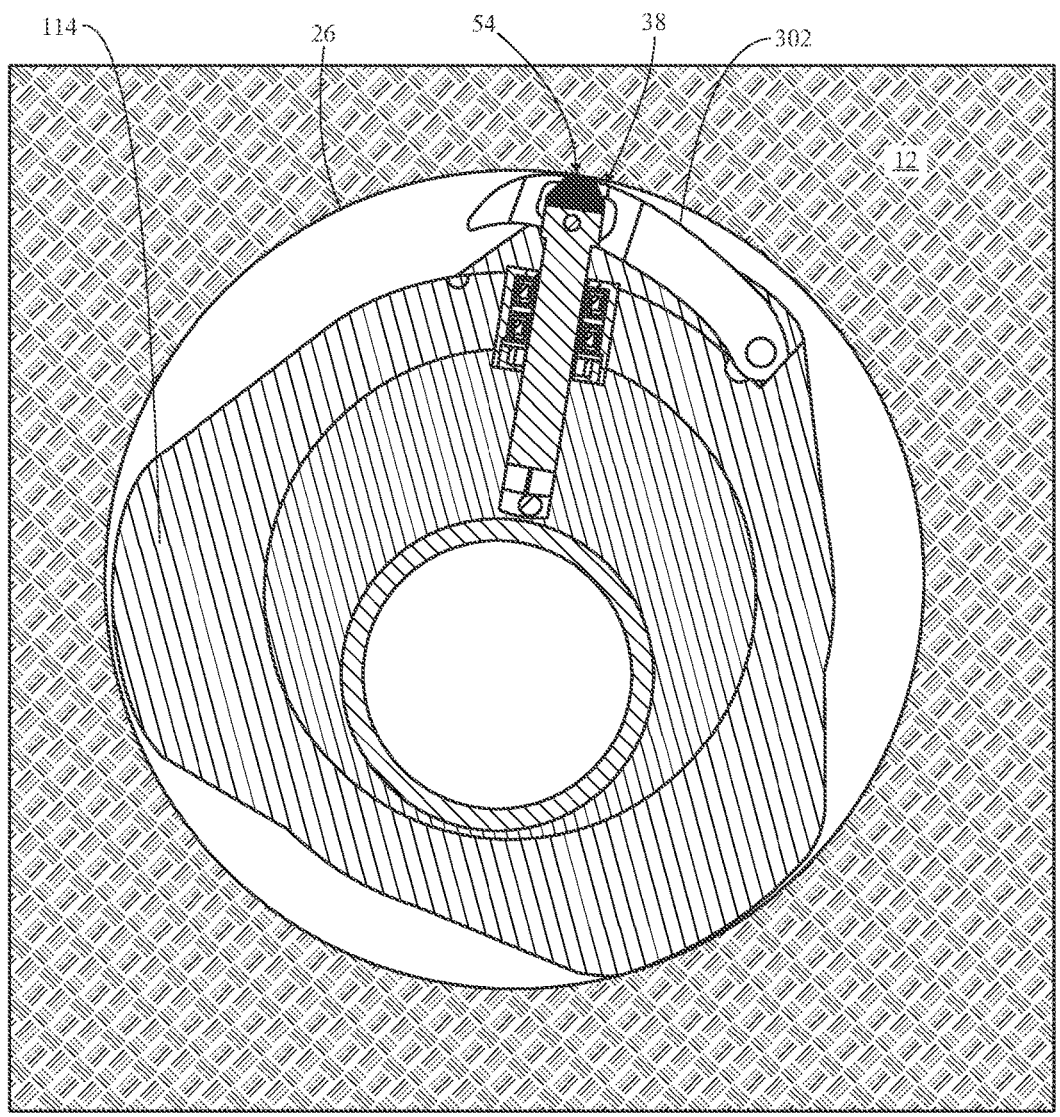
FIG. 47A is a top view of a position of the PCD electrode of FIG. 42 and the hinged pad of FIG. 43 when operating in a wellbore of a similar diameter as the diameter of a stabilizer, in accordance with an embodiment.
Figure 47B:
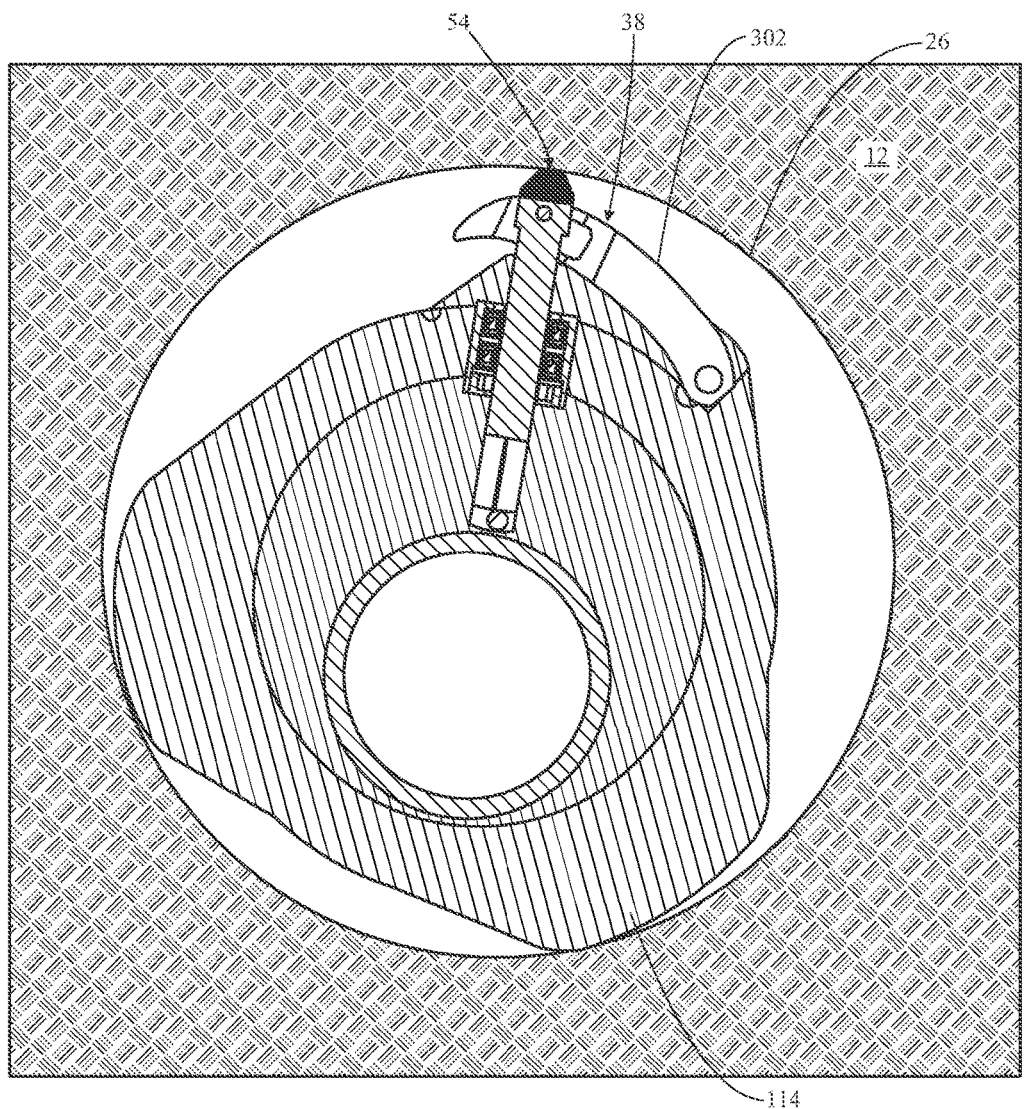
FIG. 47B is a top view of a position of the PCD electrode of FIG. 42 and the hinged pad of FIG. 43 when operating in a wellbore with a 1 inch over-gauge hole, in accordance with an embodiment.

By way of example, FIGS. 47A and 47B are top cross-sectional views of the LWD tool 38 described in FIGS. 42-45 shown within the wellbore 26. FIG. 47A depicts a top view of a position of the PCD electrode 54 and the hinged pad 302 when operating in the wellbore 26 of a similar diameter as the diameter of the stabilizer 114. Further, FIG. 47B depicts a top view of the position of the PCD electrode 54 and the hinged pad 302 when operating in the wellbore 26 with a 1 inch over-gauge hole. The PCD electrode 54 contacts the wall of the wellbore 26 in both cases, while the hinged pad 302 does not make contact in the wellbore 26 with the 1 inch over-gauge hole.

Figure 48A:
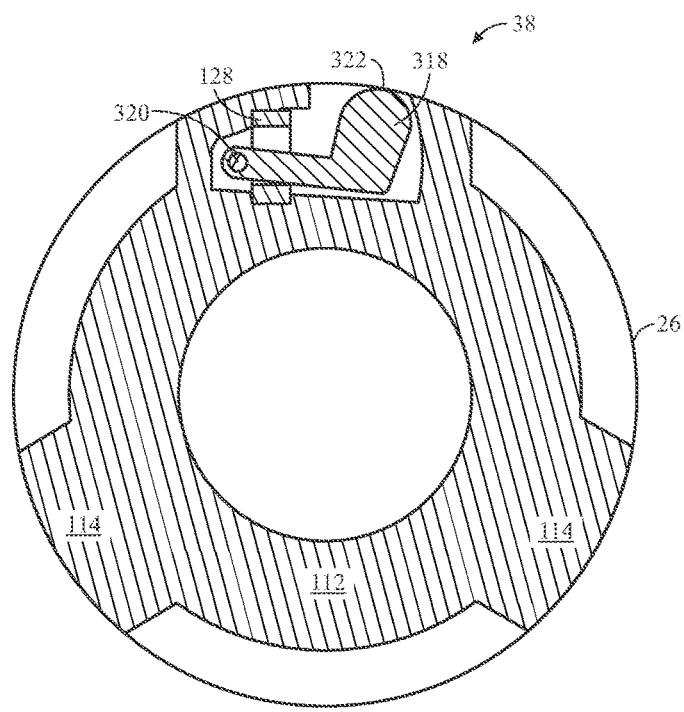
FIG. 48A is a cross-sectional view of a hinged PCD electrode, in accordance with an embodiment.
Figure 48B:
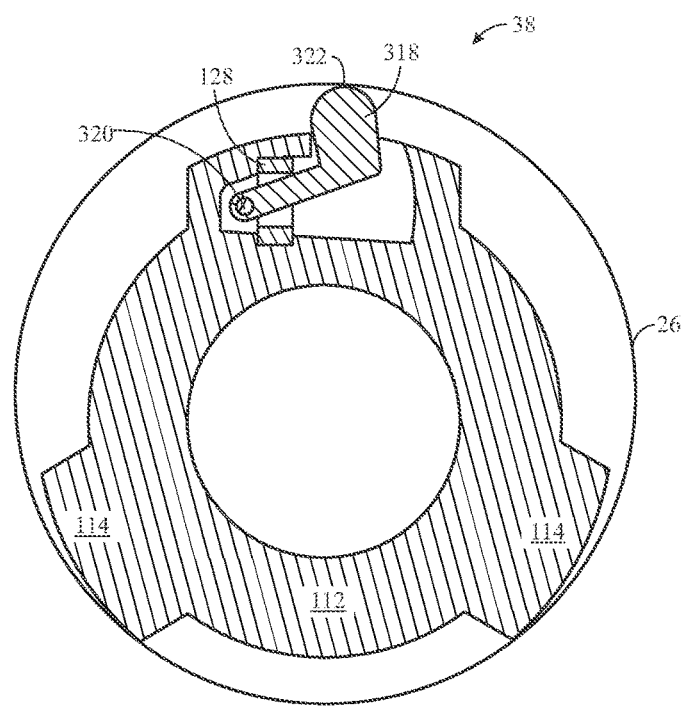
FIG. 48B is a cross-sectional view of the hinged PCD electrode of FIG. 48A in an over-gauge hole of a wellbore, in accordance with an embodiment.

Another variation of the LWD tool 38 using the techniques described above is depicted in FIGS. 48A and 48B. FIG. 48A is a cross-sectional view of a hinged PCD electrode 318. The hinged PCD electrode 318 pivots on a hinge 320, rather than stroking in and out on a straight trajectory. The wellbore 26 may be 8.5 inches in diameter, and the hinged PCD electrode 318 may be flush with the stabilizer 114. Additionally, the measure toroidal transformer 128 may be placed between the hinge 320 and a contact face 322 of the hinged PCD electrode 318. In OBM, a current may flow into the geological formation 12, and not directly through the OBM to the drill collar 112. Further, FIG. 48B is a cross-sectional view of the hinged PCD electrode 318 in an over-gauge hole of the wellbore 26. The hinged PCD electrode 318 may be extended to make contact in the over-gauge hole of the wellbore 26. The hinged PCD electrode 318 may be pressed outward against the wall of the wellbore 26 by hydraulic forces or by a spring mechanism.

For any of the embodiments discussed above, it may be desirable to determine a radial extension of the PCD electrodes 54 or the hinged PCD electrodes 318. Accordingly, FIG. 49 is a cross-sectional view of the PCD electrode 54 within the drill collar 112 with a device for detecting a radial extension 323. For proper measurements, the electrode may be forced against the formation. The measurement of the radial extension 323 of the PCD electrode 54 may function as a high resolution caliper. Accordingly, the radial extension 323 may be measured by a Hall Effect sensor 324 mounted on the drill collar 112 and a permanent magnet 326 mounted on the PCD electrode 54. An output of the Hall Effect sensor 324 may increase when a distance between the permanent magnet 326 and the Hall Effect sensor 324 decreases.

Another approach for measuring the radial extension 323 involves using an inductance of a wire loop 328 near a bottom portion of a chamber of the PCD electrode 54. A low frequency current may be applied to the wire loop 328, which may produce a local magnetic field. Because the PCD electrode 54 contains cobalt in the tungsten carbide and/or the PCD material, the proximity of the PCD electrode may affect the inductance of the wire loop 328.

By analyzing the radial extension 323 of the PCD electrode 54 versus a push force applied to the PCD electrode 54, characteristics related to rock mechanics can be deduced from the geological formation 12. In hard formations, the radial extension 323 may be small, while in soft rock, the radial extension 323 may be larger. This may enable a determination of rock strength properties (stresses) as well as a margin for stability of the wellbore 26.

FIG. 50 depicts a drill bit 340. The drill bit 340 may include: a tungsten carbide matrix body 342, which includes the PDC cutters 218; a steel locking ring 344; and a double API pin 346. To provide greater detail, FIG. 51 is a cross-sectional view of the drill bit 340. A top portion of the tungsten carbide matrix body 342 may have keys 348, which fit into matching grooves in the locking ring 344. The locking ring 344 is placed on the tungsten carbide matrix body 342, and the double API pin 346 is threaded into the matrix body. The double API pin 346 may include male threads 350, and the tungsten carbide matrix body 342 may include female threads 352 that receive the male threads 350. Accordingly, the double API pin 346 and the WC matrix body 342 may be torqued to an appropriate level. Subsequently, the locking ring 344 and the double API pin 346 may be welded together to prevent the locking ring 344 and the double API pin 346 from unscrewing.

Figure 52:
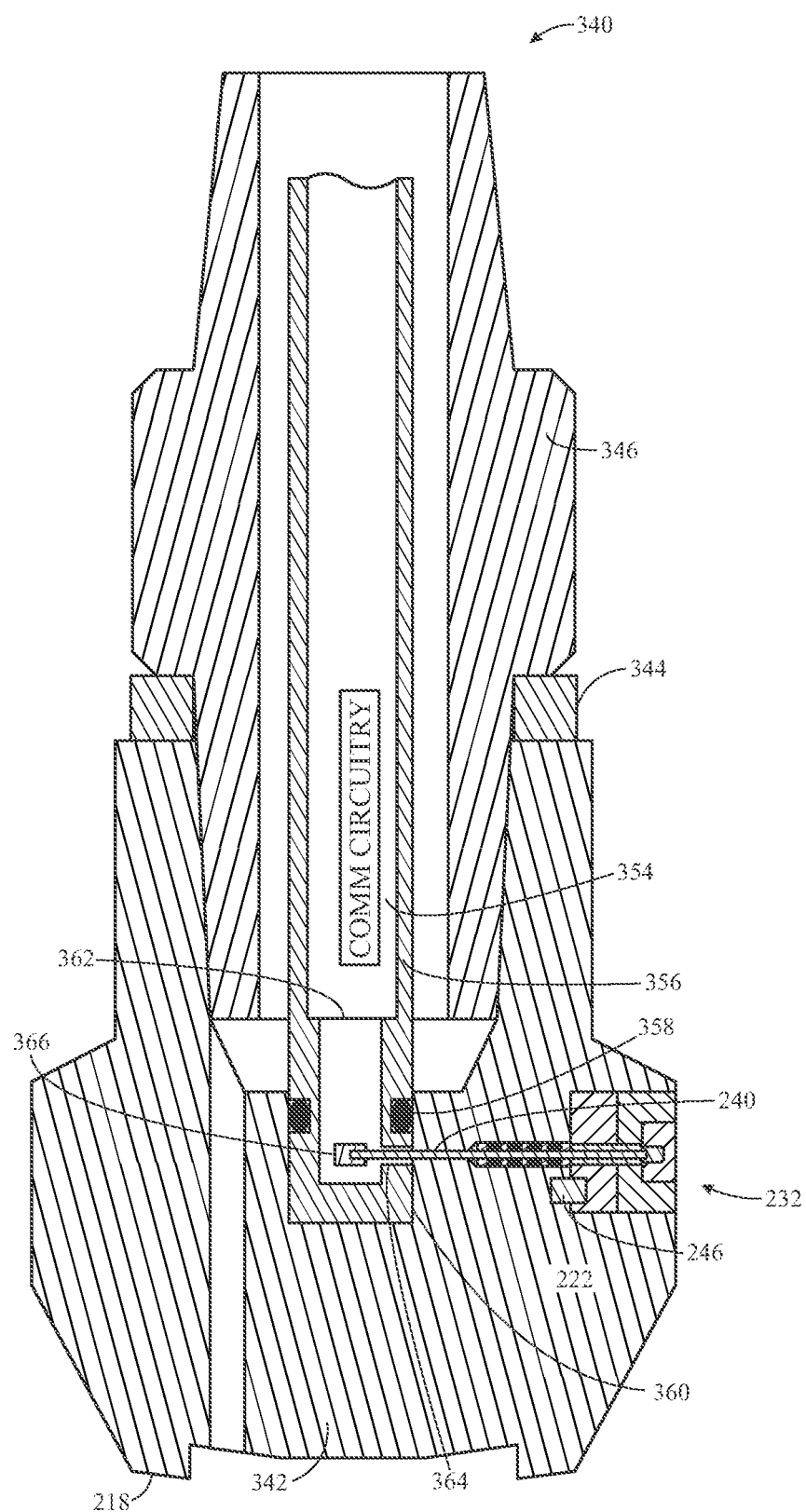
FIG. 52 is a cross-sectional view of the drill bit of FIG. 50 with a wired PCD sensor mounted on a gauge pad of the drill bit, in accordance with an embodiment.

Further, FIG. 52 is a cross-sectional view of the drill bit 340 adapted to receive the wired PCD sensor 232 mounted in the gauge pad 222. The matrix body 342 may be lengthened to accommodate coupling the wired PCD sensor 232 with communication circuitry 354. The communication circuitry 354 may include radio frequency (RF) electronics for the impedance measurement. Accordingly, the wired PCD sensor 232 may transmit RF signals into the geological formation 12 and measure impedance of the geological formation 12.

A pressure housing 356 may contain the communication circuitry 354 that performs the impedance measurements. The communication circuitry 354 may also provide azimuthal position functions, drilling mechanic functions, power functions, memory functions, and telemetry functions. Data may be acquired at the wired PCD sensor 232, and the data may be stored in a memory of the communication circuitry 354 and/or be transmitted to the MWD tool 36. A lower end of the pressure housing may contain o-rings 358, and the lower end may fit into a circular hole 360 in the matrix body 342. The o-rings 358 form a pressure seal between the pressure housing 356 and the matrix body 342. A second pressure bulkhead 362 may be incorporate within the pressure housing 356 as well. Below the o-rings 358, there may be an opening 364 in the pressure housing 356 to accept the wire 240 from the wired PCD sensor 232. The pressure housing 356 may be keyed to the matrix body 342 such that the opening 364 of the pressure housing 356 aligns with the wire 240 from the wired PCD sensor 232.

Further, the pressure housing 356 may be mechanically locked into the drill bit 340. A socket 366 in the pressure housing 356 may complete the coupling of the communication circuitry 354 to the wire 240. The coupling of the communication circuitry 354 to the wired PCD sensor 232 may be coaxial with the matrix body 342 and the pressure housing 356 acting as an outer conductor. Furthermore, the wired PCD sensor 232 is inserted into a hole in the gauge pad 222. An anti-rotation pin 246 or the transverse bolt 252 (not shown) may lock the sensor in place as previously described in the discussion related to FIG. 30. Additionally, while FIG. 52 depicts the wired PCD electrode 232 of FIGS. 30 and 31, any configurations of the wired PCD electrode 232 is contemplated for use with the drill bit 340. Moreover, it is also contemplated that the any other type of drill bit 20 is contemplated for use with the wired PCD electrodes 232.

The specific embodiments described above have been shown by way of example, and it should be understood that these embodiments may be susceptible to various modifications and alternative forms. It should be further understood that the claims are not intended to be limited to the particular forms disclosed, but rather to cover modifications, equivalents, and alternatives falling within the spirit and scope of this disclosure.

The invention claimed is:
1. A method, comprising:
placing a downhole tool in a wellbore in a geological formation, wherein the downhole tool comprises at least one electrode comprising:
 a face of electrically conductive wear-resistant material;
 a layer of insulating polycrystalline diamond material surrounding at least a portion of the at least one electrode;
 at least one transmitting toroidal transformer coupled to the at least one electrode; and
 at least one measure toroidal transformer coupled to the at least one electrode;
injecting alternating current into the geological formation via the at least one transmitting toroidal transformer of the at least one electrode;

receiving return current from the formation via the at least one measure toroidal transformer of the at least one electrode;

determining a formation resistance from the return current; and determining a formation resistivity from the formation resistance.

2. The method of claim 1, wherein the alternating current is injected into the geological formation at a frequency between 100 kHz and 100 MHz in an oil based mud (OBM) environment, and the alternating current is injected into the geological formation at a frequency between 1 kHz and 100 MHz in a water based mud (WBM) environment.

3. The method of claim 1, wherein the downhole tool is mounted on a gauge pad of a drill bit.

4. The method of claim 1, wherein the downhole tool is mounted on a drill collar.

* * * * *